(12) United States Patent
Janssen et al.

(10) Patent No.: US 12,436,454 B2
(45) Date of Patent: Oct. 7, 2025

(54) PELLICLE MEMBRANE

(71) Applicant: ASML NETHERLANDS B.V., Veldhoven (NL)

(72) Inventors: Paul Janssen, Eindhoven (NL); Maxime Biron, Bromont (CA); Inci Donmez Noyan, Eindhoven (NL); Lourdes Ferre Llin, Geldrop (NL); Adrianus Johannes Maria Giesbers, Vlijmen (NL); Johan Hendrik Klootwijk, Eindhoven (NL); Jan Hendrik Willem Kuntzel, Eindhoven (NL); Arnoud Willem Notenboom, Rosmalen (NL); Anne-Sophie Rollier, Bromont (CA); Ties Wouter Van Der Woord, Eindhoven (NL); Pieter-Jan Van Zwol, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 679 days.

(21) Appl. No.: 17/629,849

(22) PCT Filed: Jul. 24, 2020

(86) PCT No.: PCT/EP2020/070973
§ 371 (c)(1),
(2) Date: Jan. 25, 2022

(87) PCT Pub. No.: WO2021/018777
PCT Pub. Date: Feb. 4, 2021

(65) Prior Publication Data
US 2022/0269165 A1    Aug. 25, 2022

(30) Foreign Application Priority Data

Jul. 30, 2019  (EP) ..................................... 19188979
Aug. 30, 2019  (EP) ..................................... 19194571

(51) Int. Cl.
*G03F 1/64* (2012.01)
*G03F 7/00* (2006.01)

(52) U.S. Cl.
CPC ............ *G03F 1/64* (2013.01); *G03F 7/70033* (2013.01); *G03F 7/70983* (2013.01)

(58) Field of Classification Search
CPC ................. G03F 1/62; G03F 1/64; G03F 1/66
See application file for complete search history.

(56) References Cited

U.S. PATENT DOCUMENTS

| 12,298,663 B2 | 5/2025 | Peter et al. |
| 2015/0309404 A1 | 10/2015 | Lin et al. |
| 2016/0276152 A1 | 9/2016 | Tachibana et al. |
| 2017/0009027 A1 | 1/2017 | Harris, Jr. et al. |
| 2018/0239240 A1 | 8/2018 | Houweling |

FOREIGN PATENT DOCUMENTS

| CN | 106896637 | 6/2017 |
| CN | 109765752 | 5/2019 |
| EP | 3483656 | 5/2019 |
| JP | 2014519046 | 8/2014 |
| JP | 2019091001 | 6/2019 |
| TW | 201725178 | 7/2017 |
| TW | 201728989 | 8/2017 |
| TW | 201918372 | 5/2019 |
| TW | 201926413 | 7/2019 |
| WO | 2017067813 | 4/2017 |
| WO | 2019086643 | 5/2019 |
| WO | 2019211083 | 11/2019 |

OTHER PUBLICATIONS

Office Action issued in corresponding Japanese Patent Application No. 2022-503895, dated Apr. 30, 2024.
International Search Report and Written Opinion issued in corresponding PCT Patent Application No. PCT/EP2020/070973, dated Oct. 27, 2020.
Office Action issued in Korean Patent Application No. 10-2022-7003566, dated Apr. 2, 2025.

*Primary Examiner* — Daborah Chacko-Davis
(74) *Attorney, Agent, or Firm* — Pillsbury Winthrop Shaw Pittman, LLP

(57) ABSTRACT

A method of manufacturing a pellicle membrane, the method including: providing a first sacrificial layer on a planar substrate to form a stack; and providing, to at least a portion of the stack, at least one metal silicide or doped metal silicide pellicle core layer which forms at least part of the pellicle membrane is described. Also described is a pellicle membrane assembly having a substrate, a first sacrificial layer, and at least one metal silicide or doped metal silicide pellicle layer which forms at least part of a pellicle core, as well as a lithography apparatus including such a pellicle.

20 Claims, 12 Drawing Sheets

# PELLICLE MEMBRANE

CROSS-REFERENCE TO RELATED APPLICATIONS

This application is the U.S. national phase entry of PCT Patent Application No. PCT/EP2020/070973 which was filed on Jul. 24, 2020, which the benefit of priority of European Patent Application No. 19188979.9 which was filed on Jul. 30, 2019 and of European Patent Application No. 19194571.6 which was filed on Aug. 30, 2019.

FIELD

The present invention relates to a method of manufacturing a pellicle membrane. The present invention has particular, but not exclusive, use in connection with EUV lithographic apparatus and EUV lithographic tools. The present invention also relates to pellicle membrane assemblies and lithographic apparatus comprising such assemblies.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

A pattern may be imparted to a radiation beam in a lithographic apparatus using a patterning device (e.g. a mask or reticle). Radiation is provided through or reflected off the patterning device to form an image on a substrate. Contamination on the surface of the patterning device can cause manufacturing defects on the substrate. A membrane assembly, also referred to as a pellicle, may be provided to protect the patterning device from airborne particles and other forms of contamination.

Pellicles may also be provided for protecting optical components other than patterning devices. Pellicles may also be used to provide a passage for lithographic radiation between regions of the lithography apparatus which are sealed from one another. Pellicles may also be used as filters, such as spectral purity filters or as part of a dynamic gas lock of a lithographic apparatus.

The use of pellicles in lithography is well-known and well-established. A pellicle in a lithographic apparatus is a membrane (also referred to as a pellicle membrane) which is located away from the patterning device and is out of the focal plane of a lithographic apparatus in use. As the pellicle is out of the focal plane of the lithographic apparatus, contamination particles which land on the pellicle are out of focus in the lithographic apparatus. Consequently, images of the contamination particles are not projected onto the substrate. If the pellicle were not present, then a contamination particle which landed on the patterning device would be projected onto the substrate and would introduce a defect into the projected pattern.

A mask assembly may include the pellicle which protects a patterning device (e.g. a mask) from particle contamination. The pellicle may be supported by a pellicle frame, forming a pellicle assembly or membrane assembly. The pellicle may be attached to the frame, for example, by gluing or otherwise attaching a pellicle border region to the frame. The frame may be permanently or releasably attached to a patterning device. The frame may also be known as a border.

It is beneficial to manufacture pellicles with high volume manufacturing techniques, for example because pellicles must be often cleaned or replaced when contaminated or damaged.

Due to the presence of the pellicle in the optical path of the EUV radiation beam, it is necessary for the pellicle to have high EUV transmissivity. A high EUV transmissivity allows a greater proportion of the incident radiation through the pellicle. Since transmissivity is at least partially dependent on the thickness of the pellicle, it is desirable to provide a pellicle which is as thin as possible whilst remaining reliably strong enough to withstand the sometimes hostile environment within a lithography apparatus.

Due to the presence of the pellicle in the optical path of the EUV radiation beam, it may heat up. High temperatures may cause the pellicle to become damaged or break. It is desirable to decrease the operating temperature of pellicles or to provide pellicles which are able to withstand higher temperatures.

It is difficult to manufacture a pellicle assembly without the membrane assembly being deformed or damaged in the process, for example because of the thinness of the membrane. Damage to or defects in the membrane assembly may lead to reduced performance, reduced lifespan, or even breakup, which are undesired.

Etching is a common manufacturing process used to remove portions of material. In multi-layered materials, selective etching can remove a portion of a layer such that an underlying layer is exposed. Over-etching may occur when more material than desired is removed. Over-etching in pellicle manufacture may cause damage to the pellicle membrane. Over-etching may cause strength loss to the pellicle membrane, which may cause the pellicle membrane to break during fabrication, transport, or subsequent usage. It is therefore desirable to reduce the chance of over-etching. It is also desirable to develop a manufacturing process to aid the deposition of layers and/or remove portions of material in a controlled manner in order to achieve pellicle assemblies with reliable and consistent properties.

It is desirable to provide a method of manufacturing a pellicle which provides pellicles with consistent physical properties, which minimizes damage to or defects in the pellicle, and which allows for high volume manufacturing of pellicles. The present invention has been devised in an attempt to address at least some of the problems identified above.

SUMMARY

According to a first aspect there is provided a method of manufacturing a pellicle membrane, the method comprising: providing a first sacrificial layer on a planar substrate to form a stack; and providing, to at least a portion of the stack, at least one metal silicide or doped metal silicide pellicle core layer which forms at least part of the pellicle membrane.

Metal silicide and doped metal silicide may be beneficial for use in pellicle membranes due to their high EUV transmissivity. Additionally, their high emissivity may beneficially reduce the operating temperature of a pellicle membrane, thereby reducing the risk of damage to the pellicle membrane when in use. Furthermore due to their emissivity, using metal silicide or doped metal silicide as a pellicle core layer may mitigate or obviate the need for an additional emissive capping layer on the front and/or back face of the pellicle membrane. Advantageously, removing the requirement for an emissive capping layer may reduce the manufacturing time and/or reduce damage caused to the pellicle membrane during manufacture.

Methods for manufacturing other types of pellicle membranes, e.g. with silicon cores, may be sub-optimal for the manufacture of pellicle membranes comprising at least one metal silicide or doped metal silicide pellicle core layer. A method according to this aspect of the invention and related embodiments may beneficially provide a method for manufacturing a pellicle membrane comprising at least one metal silicide or doped metal silicide pellicle core layer with higher quality and/or higher yield. In particular, providing a first sacrificial layer prior to depositing the metal silicide or doped metal silicide pellicle core layer may beneficially control the properties of the surface, e.g. the surface topology, for receiving the pellicle core layer. Beneficially, the layer may have at least one of: a low number of pinholes, a low roughness, a low number of contaminant particles, a uniform layer thickness, and/or negligible amounts of air/vacuum between the surface and the pellicle core layer.

The ratios of metal, silicon and, optional dopant in metal silicide and doped metal silicide may be adjusted as required. The planar substrate may simply be referred to as a substrate.

The pellicle core layer may be deposited using physical vapor deposition (PVD). Beneficially, PVD may reduce the amount of raw material required for deposition. Beneficially, PVD may provide greater control over characteristics associated with deposition, for example the thickness of the pellicle core layer, the uniformity of the pellicle core layer, the ratio of metal, silicon and (optionally) dopant in the pellicle core layer, and/or the repeatability of these characteristics when processing multiple membranes.

The metal may comprise molybdenum. The metal M may be one of a range of metals. For example, the metal may be selected from the group comprising Ce, Pr, Sc, Eu, Nd, Ti, V, Cr, Zr, Nb, Mo, Ru, Rh, La, Y, and Be. Of this group, the preferred metals are zirconium, molybdenum, and beryllium. Molybdenum is most preferred.

The dopant may comprise nitrogen. The dopant may be any suitable dopant. For example, the dopant may be oxygen, carbon, boron, or nitrogen. Of these, the preferred dopant is nitrogen.

The first sacrificial layer may comprise an oxide. The oxide may comprise a thermal oxide. The oxide may be provided by any suitable technique. Annealing of the planar substrate may be used to provide the oxide layer. The first sacrificial layer may be arranged such that the surface of the first sacrificial layer that is to receive the at least one pellicle core layer has high smoothness and/or high cleanness. That is, it may have uniform thickness and/or low roughness and/or low contaminant particle density. By providing a surface with high smoothness, a metal silicide or doped metal silicide pellicle core layer may be deposited with high quality. High quality may mean, for example, a low number of pinholes, a uniform layer thickness, and/or negligible amounts of air/vacuum between the surface and the pellicle core layer.

The method may further comprise providing at least one additional sacrificial layer on the first sacrificial layer prior to providing the at least one pellicle core layer. There may be any number of additional sacrificial layers, for example 1 or 4. The provision of additional sacrificial layers may beneficially control surface topology of the surface that is to receive the at least one pellicle core layer. Beneficially, the layer may have high quality, for example a low number of pinholes, a uniform layer thickness and/or negligible amounts of air/vacuum between the surface and the pellicle core layer. The additional sacrificial layers may be referred to as sacrificial layers; that is, "sacrificial layers" may comprise the first sacrificial layer and, optionally, one or more additional sacrificial layers. In cases where the sacrificial layers comprise different materials, each material may have a different etch rate in one etchant compared to another. As such, this can allow highly controlled etching of the stack as certain sacrificial layers may be resistant to etchants and so over-etching may be avoided.

The at least one additional sacrificial layer may comprise an oxide or silicon. Preferably, the composition of adjacent sacrificial layers may alternate between an oxide and silicon. The oxide may be silicon oxide.

As mentioned, an oxide and silicon may have a different etch rate. Having different sacrificial layers comprising an oxide or silicon may beneficially provide different sacrificial layers with different etch rates. By having adjacent layers with different etch rates beneficially allows a layer to act as an etch stop for an adjacent layer.

The silicon may be silicon or polysilicon, doped or undoped, e.g. the silicon may be in-situ doped polysilicon. The dopant may be phosphorus or may be another dopant. The oxide may be silicon dioxide, may be formed from tetraethyl orthosilicate (TEOS), a thermal oxide, or any material with behaviour and/or chemical/physical properties similar to silicon dioxide.

The at least one additional sacrificial layer may be arranged to have controlled stress in the layer. For example, it may have tensile stress. The provision of stress in a sacrificial layer may beneficially pre-stress the at least one pellicle core layer. Pre-stressing the pellicle core layer may beneficially reduce sagging of the pellicle membrane when it is removed from a substrate and is free-standing, and when it is in use.

The first sacrificial layer may comprise amorphous carbon. The at least one additional sacrificial layer may comprise amorphous carbon. Amorphous carbon may beneficially reduce over-etching during pellicle manufacture and/or provide a diffusion barrier between layers of the pellicle membrane assembly and/or pre-stress the pellicle membrane.

The method may comprise providing three pellicle core layers on the stack. Preferably, the pellicle core layers may be deposited in the following order: a first metal silicide layer, a doped metal silicide layer, and a second metal silicide layer. A pellicle membrane with three core layers may beneficially have a high emissivity and/or high EUV transmissivity. A pellicle membrane with three core layers may be manufactured with low defectivity. A pellicle membrane comprising an ordered stack of a first metal silicide layer, a doped metal silicide layer, and a second metal silicide layer may beneficially be manufactured using PVD with relative ease and/or speed.

The method may further comprise one or more etching steps to remove at least a portion of the substrate and one or more sacrificial layers. Removing at least a portion of the substrate and one or more sacrificial layers may define a border or frame, for example around a perimeter of the pellicle membrane. Removing at least a portion of the substrate and one or more sacrificial layers may substantially release the pellicle membrane from the substrate and one or more sacrificial layers. The released pellicle membrane may form part of a pellicle assembly, wherein the pellicle assembly comprises the pellicle membrane and a border supporting the pellicle membrane. Appropriate etchants can be selected depending on the particular material which is to be etched.

The method may comprise performing at least one etching step after depositing the sacrificial layers and before depositing the pellicle core layer. This etching step may define an area to be etched in a subsequent etching step. The area defined may define a general shape of a finished pellicle assembly. The area defined may define a frame or border, for example around a perimeter of the pellicle membrane. The etching step may remove at least a portion of at least one of the one or more sacrificial layers. The etching step may optionally remove at least a portion of the substrate. Beneficially by performing this etching step to define an area to be etched in a subsequent etching step prior to depositing the pellicle core layer, damage to the pellicle core layer may be avoided.

The planar substrate may be an SOI (silicon on insulator) wafer. The planar substrate may be a silicon wafer. These types of substrate are well characterised and readily available.

The planar substrate may be annealed to provide a thermal oxide layer prior to the provision of a tetraethyl orthosilicate layer.

The final etch step may be a wet etch. Preferably, a HF wet etch which etches a tetraethyl orthosilicate layer.

The method may further comprise a plasma treatment step following the final etch step. The plasma treatment step may remove at least a portion of an amorphous carbon first sacrificial layer or additional sacrificial layer. The plasma treatment may comprise treatment with radicals, for example hydrogen radicals. Beneficially, plasma treatment may remove some portions of sacrificial layers (e.g. portions of sacrificial layers made from etch resistant but plasma sensitive materials such as amorphous carbon) without damaging or removing the pellicle membrane.

According to an embodiment of the present invention, the method includes patterning a back side of the stack following provision of the first and second sacrificial layer on the planar substrate. The back side is the side or face of the stack which is opposite to the side or face of the stack onto which the pellicle core layer is provided. As such, the back side of the stack is patterned prior to the provision of a third sacrificial layer. As explained in more detail below, this provides for a manufacturing procedure which allows for the sacrificial layers which are immediately adjacent to the pellicle core layer to be removed in different stages. This removes the need for a wet HF etch at the end of the procedure and this is advantageous as a wet HF etch can result in damage to the pellicle core layer.

The method may also include the ordered steps of: i) providing a third sacrificial layer in the form of an oxide to form a bottom oxide; ii) depositing the pellicle core layer on a face of the stack; iii) optionally depositing a capping layer in the form of a further oxide layer on a top surface of the pellicle core layer to form a top oxide layer; iv) annealing the stack; v) optionally removing the top oxide layer (where present) and/or any native oxide layer; vi) patterning a front side of the stack; vii) providing a protective layer to protect the front side of the stack; and viii) conducting a cavity etch from the back side of the stack to remove a portion of the planar substrate, first sacrificial layer, second sacrificial layer, and optionally a portion of the third sacrificial layer to define a pellicle assembly.

In existing procedures for the manufacture of a pellicle membrane assembly, silicon oxide layers are provided directly above and directly below the pellicle core layer at the stage when the ultimate free-standing membrane is separated from the supporting wafer. A final wet HF etch stage is required to etch away these sacrificial protective layers. This requires the insertion of a very thin, around 140 nm, membrane into a very reactive etchant bath. This step often results in mechanical yield loss. In addition, where the pellicle membrane core material is etched by HF, such as MoSiN, as used in embodiments of the present invention, local differences in thickness can occur due to the HF-etch, which results in non-uniformity of EUV transmissivity. Furthermore, the compressive nature of silicon oxide results in the pellicle stack, immediately prior to any HF etch, being wrinkled and subject to vibrations caused by natural vibrations, such as sound. This wrinkled state makes the pellicle very fragile and difficult to handle or process. The flowsheet according to an embodiment of the present invention, addresses or overcomes these difficulties.

The third sacrificial layer may be provided in the form of an oxide to form a bottom oxide. The term "bottom oxide" is used to denote the relative position of such an oxide to the pellicle core layer at a later stage of the process. This distinguishes it from the top oxide. This sacrificial layer may be provided by any suitable means, such as chemical or thermal, as known in the art. The third sacrificial layer can be from around 0.5 nm to around 3 nm in thickness when formed using a chemical means as known in the art, such as for example DIO3, DIO3+SC1+SC2, or DIO3+SC1. This layer functions as an etch barrier from the silicon (ISDP) etch. Previously, the bottom oxide layer needed to be removed to increase EUV transmissivity. However, it have been found that due to the extremely thin nature of the chemical oxide, that the impact on EUV transmissivity of the bottom oxide layer is limited, so it is no longer necessary to etch away the bottom oxide. This enables a process flowsheet without an HF-etch stage. Alternatively, a thermal oxide layer may be provided. This may also be referred to as a dry oxide. This type of oxide may be grown thermally in an oxygen-rich environment at high temperatures, e.g. temperatures over 900° C. The thickness of this thermal oxide layer may be from around 5 nm to 15 nm, and may typically be around 10 nm. In the present flowsheet, since there is no longer a top sacrificial layer, the bottom oxide can be removed before the free-standing membrane is separated from the wafer as part of the cavity etch. During the cavity etch, the membrane is not yet free-standing as it is covered with a protective layer, such as a polymer such as perylene, which may be a few microns in thickness. The thermal oxide can be removed by a HF or BOE bath. An advantage of using a dry oxide is that the underlying sacrificial ISDP layer is exposed to a high temperature process before the pellicle core layer is deposited on top. This high temperature helps to stabilise the ISDP layer, thereby stabilising the substrate on which the pellicle core material is deposited. In embodiments where a top oxide is not provided, this allows the pellicle to stay flat during the whole process flowsheet, thereby allowing safer handling.

In embodiments of the present invention, step iii) is optional. It has been found that the pellicle membrane is sufficiently robust to handle the subsequent process steps without impact on final performance. As such, a top oxide is not strictly necessary and by eliminating this layer, it is possible to provide a process flowsheet which does not include an HF etch. Consequently, step v) is also optional.

The capping layer of step iii) may be formed from TEOS, although any other suitable process as known in the art may be used.

The protective layer may be formed from a polymeric material, such as perylene. Again, any suitable protective material which is known for use in protecting materials during an etching process may be used.

The protective layer may be removed to release the pellicle membrane assembly. The protective layer may be removed by oxygen plasma. As such, if no final HF etch is performed, a thin silicon dioxide layer, around 1 to 2 nm in thickness, will remain on top of the pellicle core membrane.

As described above, the third sacrificial layer may be a chemical oxide or a thermal oxide.

The method may not include a wet HF etching step. Due to the design of the flowsheet, it is possible to avoid the need for a risky HF etch during the process.

The present method has been found to decrease the EUV transmissivity non-uniformity by around 3 times due to the elimination of a final HF etching step. As it is desirable to minimise EUV transmissivity non-uniformity, the present method provides an improved final pellicle product which would not be possible by using other flowsheets. As such, the final product is distinguished from seemingly similar pellicle assemblies by having an EUV transmissivity non-uniformity of less than 0.15%.

According to a second aspect of the invention there is provided a pellicle membrane assembly comprising a substrate, a first sacrificial layer, and at least one metal silicide or doped metal silicide pellicle layer which forms at least part of a pellicle core.

Metal silicide and doped metal silicide may be beneficial for use in pellicle membranes due to their high EUV transmissivity. Additionally, their high emissivity may beneficially reduce the operating temperature of a pellicle membrane, thereby reducing the risk of damage to the pellicle membrane when in use. Furthermore due to their emissivity, using metal silicide or doped metal silicide as a pellicle core layer may mitigate or obviate the need for an additional emissive capping layer on the front and/or back face of the pellicle membrane. Advantageously, removing the requirement for an emissive capping layer may reduce the manufacturing time and/or reduce damage caused to the pellicle membrane during manufacture. Therefore, an assembly according to the present invention may support an improved pellicle membrane. For example, the pellicle membrane may be higher quality and/or be able to be produced with higher yield compared to other pellicle membranes. The pellicle membrane may have higher transmissivity and higher emissivity than other pellicle membranes.

The assembly may further comprise at least one additional sacrificial layer disposed between the first sacrificial layer and the at least one pellicle core layer. There may be any number of additional sacrificial layers, for example 1 or 4. The provision of additional sacrificial layers may beneficially control the surface topology of the surface that is to receive the at least one pellicle core layer, for example to increase the smoothness. The additional sacrificial layers may be referred to as sacrificial layers; that is, "sacrificial layers" may comprise the first sacrificial layer and, optionally, one or more additional sacrificial layers. In addition, different sacrificial layers may be selected which have improved adhesion characteristics between layers. For example, there may be decreased lattice mismatch between layers, which reduces the chances of delamination.

The assembly may comprise at least three sacrificial layers. The first and second sacrificial layers may comprise the same material, preferably wherein the material is a thermal oxide, preferably silicon oxide.

The at least one pellicle core layer may comprise a first pellicle core layer, a second pellicle core layer, and a third pellicle core layer. Preferably, the first and third pellicle core layers may comprise metal silicide and the second pellicle core layer may comprise doped metal silicide. The metal may be molybdenum. A pellicle membrane with three core layers may beneficially have a high emissivity and/or high EUV transmissivity. A pellicle membrane with three core layers may be manufactured with low defectivity. A pellicle membrane comprising an ordered stack of a first metal silicide layer, a doped metal silicide layer, and a second metal silicide layer may beneficially be manufactured using PVD with relative ease and/or speed.

The substrate may form at least part of a border holding or supporting the pellicle membrane.

The border may comprise an ordered sequence of: a portion of a planar substrate, and at least one sacrificial layer, wherein the at least one sacrificial layer is adjacent the pellicle membrane/core. The pellicle assembly may be manufactured by deposition of at least one metal silicide or doped metal silicide pellicle core layer which forms part of the pellicle membrane, wherein the assembly comprises a substrate and one or more sacrificial layers, and selectively etching one or more portions of the substrate to define the border. Therefore, the border may be similar in composition to the assembly in that, if the stack is an ordered sequence of a substrate and one or more sacrificial layers, the border will comprise portions of a corresponding ordered sequence of a substrate and one or more sacrificial layers.

The at least one sacrificial layer may comprise an oxide or silicon. Preferably, the composition of adjacent sacrificial layers may alternate between an oxide and silicon.

An oxide and silicon may have a different etch rate. Having different sacrificial layers comprising an oxide or silicon may beneficially provide different sacrificial layers with different etch rates. By having adjacent layers with different etch rates beneficially allows a layer to act as an etch stop for an adjacent layer.

The silicon may be silicon or polysilicon, doped or undoped, e.g. the silicon may be in-situ doped polysilicon. The dopant may be phosphor or may be another dopant. The oxide may be silicon dioxide, tetraethyl orthosilicate (TEOS), a thermal oxide, or any material with behaviour similar to silicon dioxide.

The at least one additional sacrificial layer may be arranged to have controlled stress in the layer. For example, it may have tensile stress. The provision of stress in a sacrificial layer may beneficially pre-stress the at least one pellicle core layer. Pre-stressing the pellicle core layer may beneficially reduce sagging of the pellicle membrane when it is removed from a substrate and free-standing, and when it is in use.

The sacrificial layer adjacent the pellicle membrane may comprise an oxide and may be substantially thinner than the pellicle membrane.

By thin, it is meant that the thickness of the sacrificial layer adjacent the pellicle membrane is substantially smaller than the thickness of the pellicle membrane. The sacrificial layer adjacent the pellicle membrane may be known as a thin oxide layer. Thin layers of oxide are easily grown with a well-known layer thickness. A thin oxide layer adjacent the pellicle membrane may provide a smooth surface for the pellicle membrane. A thin oxide layer adjacent the pellicle membrane may allow for a pellicle membrane with low defectivity.

The first sacrificial layer or at least one at least on additional sacrificial layer may comprise amorphous carbon. Amorphous carbon may beneficially reduce over-etching during pellicle manufacture and/or provide a diffusion barrier between layers of the pellicle membrane assembly and/or pre-stress the pellicle membrane.

The sacrificial layer adjacent the pellicle membrane may comprise amorphous carbon. The sacrificial layer adjacent the pellicle membrane may be substantially thinner than the pellicle membrane. Beneficially, a thin amorphous carbon sacrificial layer may provide an advantageous amount of over-etching reduction and/or diffusion reduction and/or pre-stressing.

The first and third pellicle layers may comprise metal silicide. The second pellicle core layer may comprise amorphous carbon. Beneficially, an amorphous carbon pellicle core layer may provide tension in the pellicle membrane. Beneficially, an amorphous carbon pellicle core layer may reduce sagging in the pellicle membrane.

According to a third aspect of the invention there is provided a method of manufacturing a pellicle membrane, the method comprising: providing at least one amorphous carbon layer adjacent to a pellicle layer which forms at least a part of the pellicle membrane.

Amorphous carbon may beneficially reduce over-etching during pellicle manufacture and/or provide a diffusion barrier between layers of the pellicle membrane assembly and/or pre-stress the pellicle membrane.

The pellicle core layer may comprise metal silicide or doped metal silicide. Metal silicide and doped metal silicide may be beneficial for use in pellicle membranes due to their high EUV transmissivity. Additionally, their high emissivity may beneficially reduce the operating temperature of a pellicle membrane, thereby reducing the risk of damage to the pellicle membrane when in use. Furthermore due to their emissivity, using metal silicide or doped metal silicide as a pellicle core layer may mitigate or obviate the need for an additional emissive capping layer on the front and/or back face of the pellicle membrane. Advantageously, removing the requirement for an emissive capping layer may reduce the manufacturing time and/or reduce damage caused to the pellicle membrane during manufacture.

According to a fourth aspect of the invention there is provided a pellicle membrane assembly comprising a substrate, at least one amorphous carbon layer, and a pellicle membrane.

Amorphous carbon may beneficially reduce over-etching during pellicle manufacture and/or provide a diffusion barrier between layers of the pellicle membrane assembly and/or pre-stress the pellicle membrane.

The pellicle core layer may comprise metal silicide or doped metal silicide. Metal silicide and doped metal silicide may be beneficial for use in pellicle membranes due to their high EUV transmissivity. Additionally, their high emissivity may beneficially reduce the operating temperature of a pellicle membrane, thereby reducing the risk of damage to the pellicle membrane when in use. Furthermore due to their emissivity, using metal silicide or doped metal silicide as a pellicle core layer may mitigate or obviate the need for an additional emissive capping layer on the front and/or back face of the pellicle membrane. Advantageously, removing the requirement for an emissive capping layer may reduce the manufacturing time and/or reduce damage caused to the pellicle membrane during manufacture.

The thickness of the amorphous carbon layer may be substantially thinner than the pellicle membrane. Beneficially, a thin amorphous carbon sacrificial layer may provide an advantageous amount of over-etching reduction and/or diffusion reduction and/or pre-stressing.

The substrate may form at least part of a border holding the pellicle membrane.

The border may be defined using one or more etching steps to remove at least a portion of the substrate and, optionally if present, one or more sacrificial layers. Appropriate etchants can be selected depending on the particular material which is to be etched. A final etch step may be a wet etch. Preferably, a HF wet etch which etches a tetraethyl orthosilicate layer.

The border may be referred to as a frame. The border may extend for example around a perimeter of the pellicle membrane. Removing at least a portion of the substrate and one or more sacrificial layers may substantially release the pellicle membrane from the substrate and one or more sacrificial layers.

The released pellicle membrane may form part of a pellicle assembly, wherein the pellicle assembly comprises the pellicle membrane and a border supporting the pellicle membrane.

The planar substrate may be an SOI (silicon on insulator) wafer. The planar substrate may be a silicon wafer. These types of substrate are well characterised and readily available.

The planar substrate may be annealed to provide a thermal oxide layer prior to the provision of a tetraethyl orthosilicate layer.

The border comprises an ordered stack of: a portion of a planar substrate, and a portion of an amorphous carbon layer, wherein the at least one amorphous carbon layer is adjacent the pellicle membrane.

According to a fifth aspect of the invention there is provided a lithographic apparatus comprising any of the pellicle assemblies described above or pellicle membranes or pellicle assemblies manufactured according to any preceding claim.

The features described in respect of any of the aspects may be combined with the features described in respect of any of the other aspects of the present invention.

The present invention will now be described with reference to an EUV lithography apparatus. However, it will be appreciated that the present invention is not limited to EUV lithography and may be suitable for other types of lithography.

BRIEF DESCRIPTION OF THE DRAWINGS

Embodiments of the invention will now be described, by way of example only, with reference to the accompanying schematic drawings, in which.

DETAILED DESCRIPTION

Figure 1:
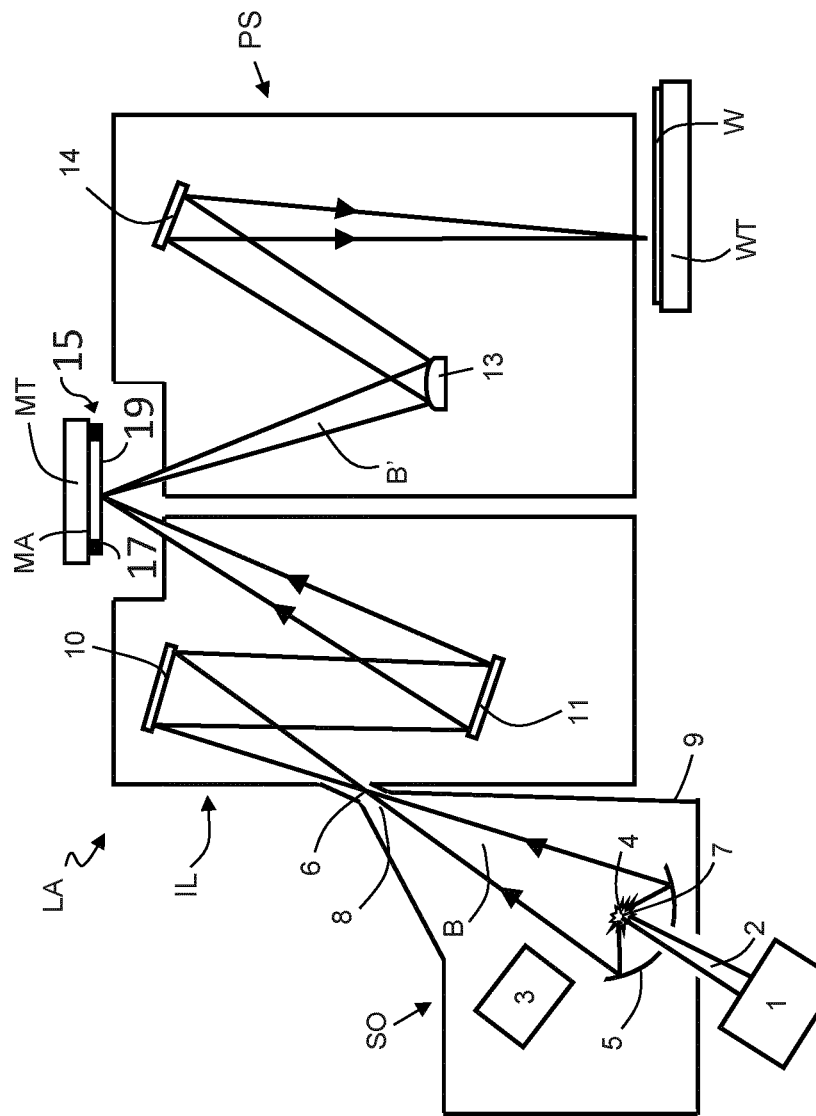
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated.

A pellicle assembly 15 is depicted in the path of the radiation to protect the patterning device MA. The pellicle assembly 15 comprises a pellicle membrane 19 and a frame 17 which supports the pellicle membrane 19. The frame 17 may be referred to as a border. The pellicle membrane 19 comprises a thin film that is substantially transparent to EUV radiation (although it will absorb a small amount of EUV radiation). The pellicle membrane 19 acts to protect the patterning device MA from particle contamination. The pellicle membrane 19 may be referred to simply as a pellicle. It will be appreciated that the pellicle assembly 15 may be located in any required position and may be used to protect any elements of the lithographic apparatus e.g. one or more of the mirrors in the lithographic apparatus.

Whilst efforts may be made to maintain a clean environment inside the lithographic apparatus LA, particles may still be present inside the lithographic apparatus LA. In the absence of a pellicle 19, particles may be deposited onto the patterning device MA. Particles on the patterning device MA may disadvantageously affect the pattern that is imparted to the radiation beam B and therefore the pattern that is transferred to the substrate W. The pellicle 19 provides a barrier between the patterning device MA and the environment in the lithographic apparatus LA in order to prevent particles from being deposited on the patterning device MA.

In use, the pellicle 19 is positioned at a distance from the patterning device MA that is sufficient that any particles that are incident upon the surface of the pellicle 19 are not in the focal plane of the radiation beam B. This separation between the pellicle 19 and the patterning device MA, acts to reduce the extent to which any particles on the surface of the pellicle 19 impart a pattern to the radiation beam B. It will be appreciated that where a particle is present in the beam of radiation B, but at a position that is not in a focal plane of the beam of radiation B (i.e., not at the surface of the patterning device MA), then any image of the particle will not be in focus at the surface of the substrate W. In some embodiments, the separation between the pellicle 19 and the patterning device MA may, for example, be between 2 mm and 3 mm (e.g. around 2.5 mm). In some embodiments, a separation between the pellicle 19 and the patterning device may be adjustable.

After the generation of the patterned EUV radiation beam B', the projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

Figure 2:
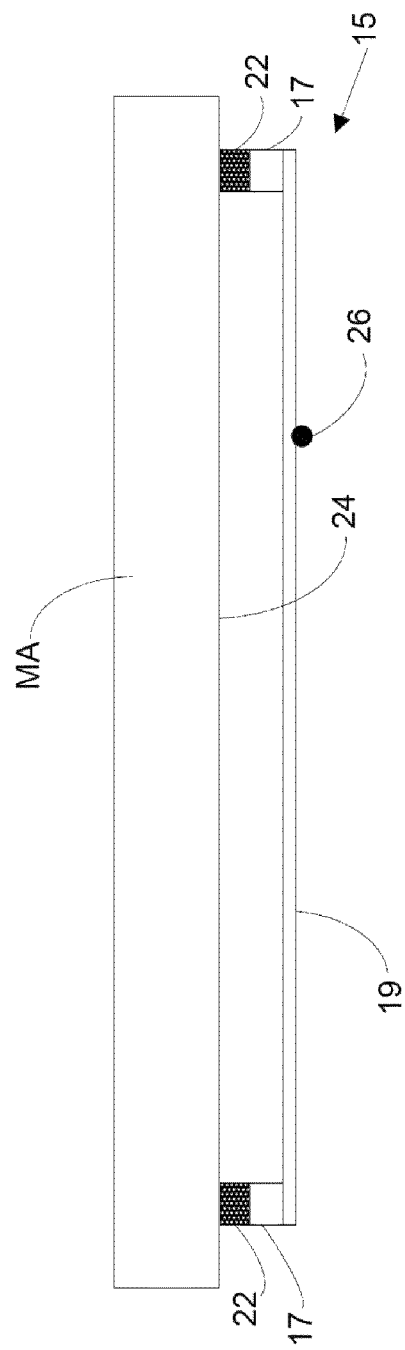
FIG. 2 depicts a pellicle assembly.

FIG. 2 is a schematic illustration of the pellicle assembly 15 and the patterning device MA in cross-section and in more detail. The patterning device MA has a patterned surface 24. The pellicle frame 17 (or 'border') supports the pellicle 19 around a perimeter portion of the pellicle 19. The pellicle frame 17 may include an attachment mechanism 22 configured to allow the pellicle frame 17 to be removably attachable to the patterning device MA (i.e. to allow the pellicle frame 17 to be attachable to and detachable from the patterning device MA). The attachment mechanism 22 is configured to engage with an attachment feature (not shown) provided on the patterning device MA. The attachment feature may, for example, be a protrusion which extends from the patterning device MA. The attachment mechanism 22 may, for example, comprise a locking member which engages with the protrusion and secures the pellicle frame 17 to the patterning device MA. The pellicle frame 17 may be attached to the mask via a further pellicle frame. A plurality of attachment mechanisms and associated attachment features may be provided. The attachment mechanisms may be distributed around the pellicle frame 17 (e.g. two on one side of the frame and two on an opposite side of the frame). Associated attachment features may be distributed around the perimeter of the patterning device MA. It should be understood that any other attachment mechanism or positioning method may be used to position the pellicle membrane 19 in the desired position.

A contamination particle 26 is schematically shown in FIG. 2. The contamination particle 26 was incident upon the pellicle 19 and is held by the pellicle 19. The pellicle 19 holds the contamination particle sufficiently far from the patterned surface 24 of the mask MA that it is not imaged onto substrates by the lithographic apparatus LA. A pellicle assembly according to an embodiment of the invention may allow a mask pattern (on the patterning device) to be provided which remains substantially defect free during use (the mask pattern is protected from contamination by the pellicle).

The pellicle assembly 15 may be constructed by depositing the pellicle 19 directly on top of a substrate which is to provide the frame 17. The substrate may be, for example, a silicon wafer or an SOI wafer. After deposition of a film defining the pellicle 19, the substrate may be selectively back-etched to remove a central portion of the substrate and leave only an outer perimeter to form the frame 17 to support the pellicle 19. The fabrication process will be discussed further below.

Pellicles are known in the art and typically have a core layer made of silicon, for example polysilicon. The applicant has realized that various other materials may be beneficial. In particular, the applicant has found that metal silicide or doped metal silicide may be beneficial.

Doped metal silicide may be described by the formula $M_x(Si)_yD_z$, where M denotes a metal, Si denotes silicon, and D denotes a dopant. The subscripts x, y and z denote the relative ratios of M, Si and D respectively.

The metal M may be one of a range of metals. For example, the metal may be selected from the group comprising Ce, Pr, Sc, Eu, Nd, Ti, V, Cr, Zr, Nb, Mo, Ru, Rh, La, Y, and Be. Of this group, the preferred metals are zirconium, molybdenum or beryllium. Molybdenum is the most preferred.

The dopant D may be one of a range of dopants. For example, the dopant may be oxygen, carbon, boron or nitrogen. Of these, the preferred dopant is nitrogen.

Of particular interest is nitridated molybdenum silicide (MoSiN) and molybdenum silicide (MoSi). The relative ratios of molybdenum, silicon and, optionally, nitrogen may be altered.

The deposition of a metal silicide or doped metal silicide will be described below with reference to MoSiN and MoSi at times, although it should be understood that the following processes are applicable to any metal silicide or doped metal silicide.

Metal silicides are emissive materials. Emissive materials are generally desirable for membranes within lithographic apparatuses (or any system where the membrane will be in a radiation beam). Emissive materials may emit infra-red radiation and therefore lose heat they have gained through absorbing radiation. As stated above, heating of pellicles is problematic and may lead to pellicle damage and/or breakage. Emissive materials may beneficially reduce the operating temperature of the pellicle which may in turn increase the lifespan of the pellicle and/or reduce damage of the pellicle.

Typically, pellicles are not highly emissive but are treated with an emissive material such as ruthenium and/or molybdenum and/or zirconium, etc. For example, pellicles with a silicon core layer must be processed to increase their emissivity. This has been done by providing an emissive capping layer on the front and/or back face of a pellicle membrane. This capping layer is generally provided on a free-standing pellicle, e.g. an emissive material is deposited onto a pellicle membrane that is freely suspended within its frame. This process may be referred to as deposition onto a free-standing pellicle. This process may also be referred to as back-end-of-line processing, due to its temporal location as a final or near-final processing step in the production line. Significant manufacturing difficulties arise from back-end-of-line processing. In particular, due to the free-standing nature of a pellicle membrane at this point, the membrane is easily damaged. Additionally, should any damage occur at this stage in the production line, the entire process must be repeated, leading to long delay times. As such, it is beneficial to reduce or obviate back-end-of-line processing.

The applicant has realized that, by using an emissive material such as metal silicide or doped metal silicide as a core layer in a pellicle, additional processing to increase emissivity (and therefore back-end-of-line processing) may be reduced or avoided altogether.

However, the typical production lines and techniques for manufacturing typical pellicles are not suitable for manufacturing pellicles with metal silicide or doped metal silicide as a core layer, especially not at the high volume manufacturing capacity required for pellicles. As such, the applicant has developed manufacturing techniques which allow for the manufacture of pellicles with metal silicide or doped metal silicide as a core layer.

Typically, pellicle core layers e.g. silicon are deposited using chemical vapor deposition (CVD). However, this is not an optimal process for the deposition of doped metal silicide. This is in part due to CVD being a stoichiometric process and therefore it is difficult to control the amount of dopants within a material.

Deposition of doped metal silicide, on the other hand, is preferentially performed using physical vapor deposition (PVD) rather than CVD. Beneficially, PVD has better process control and can therefore control the amount of dopants in a more controlled manner. Furthermore, PVD has better process control regarding the thickness, uniformity and repeatability of deposition of doped metal silicide and metal silicide. An additional advantage to PVD is its directionality of deposition: as it deposits directionally, the areas for deposition can be chosen with relative ease rather than CVD which may deposit material in unwanted areas. For example, when depositing material onto a substrate, using PVD it is relatively straightforward to deposit material onto one face (or only one area) of the substrate whereas CVD will preferentially deposit material onto all faces of the substrate. Deposition onto only one face or area represents a reduction in the use of raw material which is advantageous for example due to costs and for environmental concerns. Reduction of the use of raw material is also beneficial for reducing contamination, as unwanted areas of material may be removed later in the manufacturing process, which can lead to contamination of the pellicle membrane, processing equipment, or lithographic apparatus.

There are some initial disadvantages of using PVD, which the methods of embodiments of the invention overcome.

Depositing a pellicle layer comprising metal silicide or doped metal silicide onto a substrate has the disadvantage that the layer is not conformal. For example, if the substrate has any surface texture, the pellicle layer will not perfectly cover all surface features and defects may form. For example, there may be pinholes (i.e. gaps) in the layer, there may be areas of greater or lesser depth, and/or there may be 'bridging' features whereby there is air between a portion of the layer and the substrate. Bridging features are particularly common between two proximal surface features of a substrate, and wherein the layer covering said features does not contact the surface between the features but rather is suspended between them. All defects may reduce the quality of the resultant pellicle film, and may for example lead to breakage. Bridging features are particularly problematic as these suspended areas may break either during manufacture or in use, and may contaminate either the pellicle membrane or other areas of the manufacturing equipment or lithographic apparatus.

Another disadvantage is that with PVD it is typically needed to process one (or a small number of) wafer at a time due to the directionality of the process. As a result, the speed of manufacture is relatively slow compared to conventional methods. The speed must be increased to enable high volume manufacturing of metal silicide and doped metal silicide pellicles.

The applicant has developed manufacturing processes wherein pellicles with metal silicide or doped metal silicide pellicle layers may be manufactured with the required quality and yield. The manufacturing processes will be described, by way of embodiment, below and with reference to FIGS. 3 to 5 and 7.

It should be noted that the figures are intended to be illustrative and are, as such, not drawn to scale. This is of particular importance when considering the thickness of, for example, pellicle layers with respect to, for example, the planar substrate. This is also of particular importance when considering the stages of manufacturing. Key stages of manufacture are shown, although it should be understood that these are illustrative in nature and additional steps and processes may take place before, during, between, and/or after the steps as shown. Additionally, some stages may be illustrated as a single step (e.g. an etch process) but may in fact be performed as several sequential smaller processes with the overall effect illustrated by the single step.

The processes below refer to etching. Etching is a common manufacturing process used to remove portions of material. In multi-layered materials, selective etching can remove a portion of an outer layer such that an underlying layer is exposed. Etching may comprise providing a resist, for example a photoresist, and patterning the resist. The invention is not particularly limited by the nature of the resist and any suitable resist may be used. The resist serves to protect the underlying layers from etching. As such, the patterning of the resist serves to define the areas of the stack which are removed by a subsequent etching step. The etchant may be a chemical etchant, such as, for example, phosphoric acid and/or hydrofluoric acid.

Figure 3:
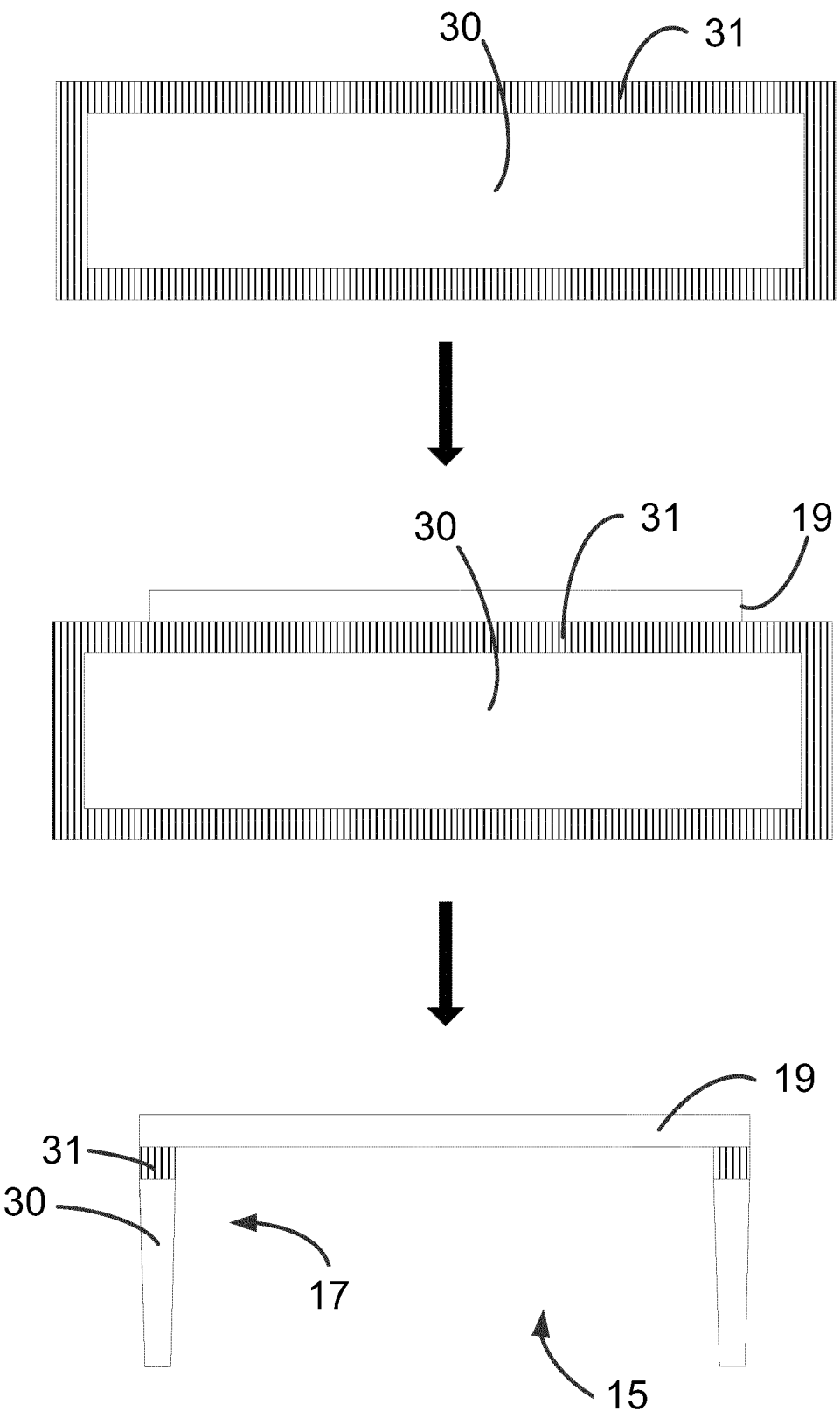
FIG. 3 illustrates stages of manufacture of a pellicle membrane and pellicle assembly according to an embodiment of the present invention.

FIG. 3 schematically illustrates stages of manufacture of a pellicle assembly 15 according to an embodiment of the invention. The pellicle assembly (and precursor stages) are illustrated in cross-section.

A planar substrate 30 is provided, which may be referred to simply as a substrate 30. The substrate 30 may be, for example, a silicon wafer. The substrate 30 has a shape such as a square, a circle or a rectangle, for example. The shape of the substrate 30 is not particularly limited, but is most likely circular as this is the most commonly available shape. The size of the substrate 30 is not particularly limited.

A first sacrificial layer 31 is provided, for example by depositing it on the substrate 30. The substrate 30 and the sacrificial layer 31 may be referred to together as a stack. The first sacrificial layer 31 preferably substantially surrounds the substrate 30, but in some embodiments it may only partially surround the substrate 30. The first sacrificial layer may comprise an oxide, for example, silicon oxide or a thermal oxide. The first sacrificial layer 31 beneficially provides a substantially flat surface in preparation for receiving a pellicle layer. Additionally or alternatively, depending on the choice of first sacrificial layer 31 it can beneficially provide a substantially clean and/or pinhole free and/or uniform surface in preparation for receiving a pellicle layer. That is, the first sacrificial layer controls the surface topology.

A pellicle membrane 19 is provided on a face of the first sacrificial layer 31. That is, the pellicle membrane 19 is provided on a face of the stack. The pellicle membrane 19 may comprise one or more pellicle layers. Some example embodiments of multi-layered pellicle membranes are described further below and with reference to FIG. 5. The pellicle membrane 19 shown in FIG. 3 comprises a single pellicle layer comprising doped metal silicide. The pellicle layer will form the core layer of the pellicle membrane 19.

As discussed previously, metal silicide and doped metal silicide may be deposited by physical vapor deposition (PVD). As deposition of metal silicide or doped metal silicide in this way causes a non-conformal coating, it is important to provide a smooth and/or clean (i.e. low number/density of contaminant particles) surface beneath the pellicle membrane 19 (that is, the surface upon which a pellicle layer is deposited). A rough and/or contaminated surface, on the other hand, may lead to holes in the pellicle layer and/or contamination of the membrane and other equipment as discussed above.

Additionally or alternatively, the surface beneath the pellicle membrane 19 may be optimized by beneficially controlling the surface topology. As such, additionally or alternatively to a smooth and/or clean surface, the surface may beneficially have a low number of pinholes and/or a uniform layer thickness.

The provision of a first sacrificial layer 31 can beneficially provide an optimised surface compared to coating onto the substrate 30. The first sacrificial layer 31 can be adjusted so as to provide greater smoothness, for example a thicker first sacrificial layer 31 may provide a smoother surface. The first sacrificial layer 31 can be adjusted so as to provide a surface relatively free from contaminant particles and/or a uniform layer thickness and/or a low number of pinholes. Alternatively (or in addition), additional sacrificial layers can be added between the first sacrificial layer 31 and the pellicle membrane 19.

After deposition of the pellicle membrane 19, the substrate 30 and first sacrificial layer 31 may be selectively back-etched to remove a central portion of the substrate and sacrificial layer and leave only an outer perimeter to form the frame 17 to support the pellicle membrane 19. The frame 17 therefore comprises a portion of the substrate 30 and a portion of the first sacrificial layer 31, wherein the first sacrificial layer 31 is disposed between the substrate 30 and the pellicle membrane 19.

The pellicle layer comprises doped metal silicide, some of the benefits of which are discussed above. In particular, the pellicle layer is emissive, which obviates the need for back-end-of-line processing, that is any additional processing steps following back-etching the substrate 30 and sacrificial layer 31 to form the frame 17 of the pellicle assembly 15. The removal of this process both reduces the risk of damage to the pellicle membrane 19 and increases the speed of manufacture of a single pellicle assembly 15. The speed is increased, in part because the back-end-of-line processing steps are removed. The speed is also increased, in part because only one emissive layer deposition step is required (as opposed to two emissive layer deposition steps which is beneficial for known silicon pellicles as both the front and back face must be coated). This is of particular importance as, in typical processing lines, the emissive layer deposition step can be a 'bottle-neck' tool that greatly increases the processing time of a pellicle assembly, so reducing the number of emissive layer deposition steps can greatly reduce the processing time of a pellicle assembly.

Figure 4:
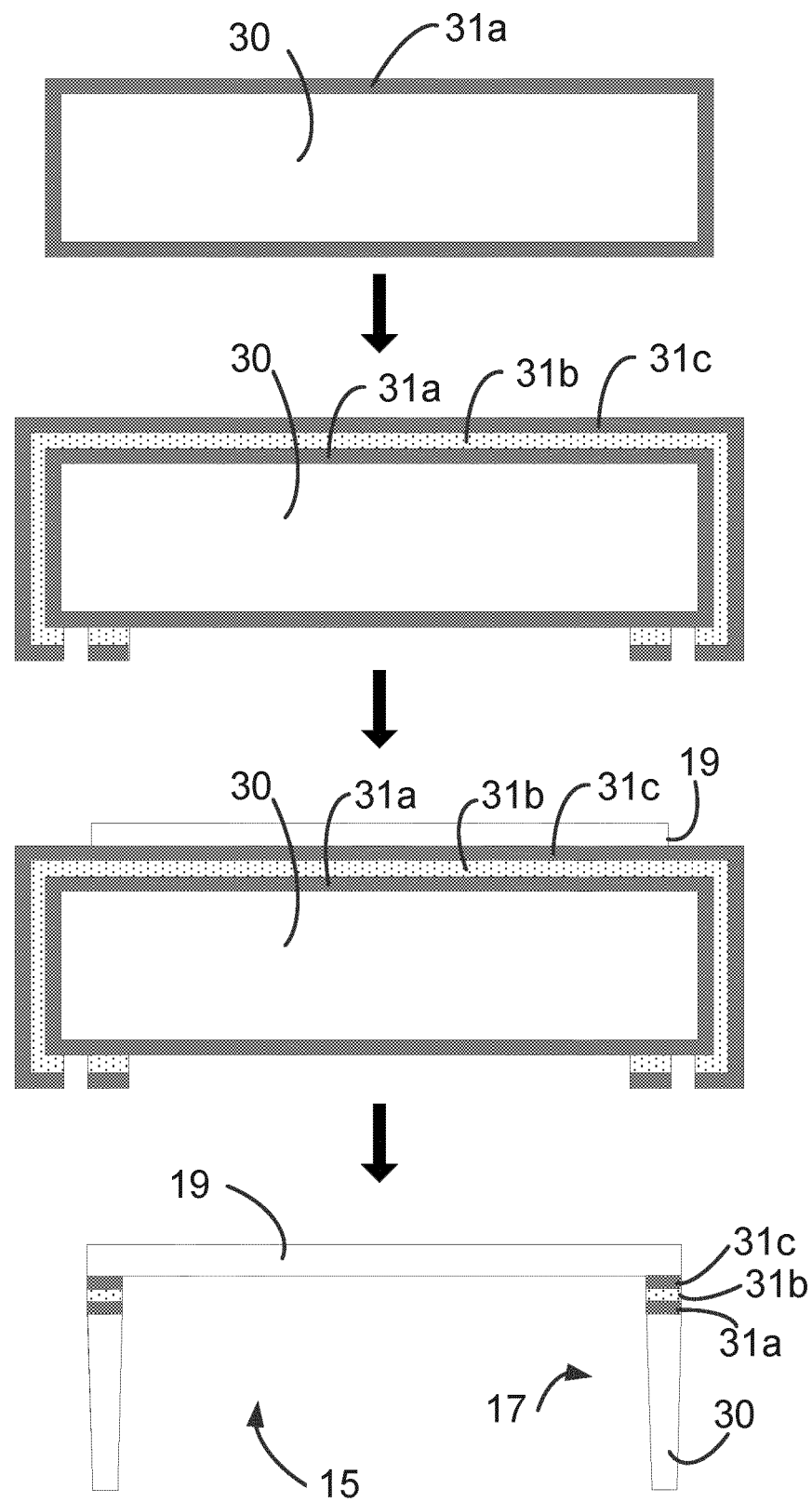
FIG. 4 illustrates stages of manufacture of a pellicle membrane and pellicle assembly according to another embodiment of the present invention.

FIG. 3 depicts a stack with one sacrificial layer, but additional sacrificial layers can be provided. Any number of additional sacrificial layers may be provided, for example 1 or 4. FIG. 4 schematically illustrates stages of manufacture of a pellicle assembly 15 according to an embodiment of the invention where 2 additional sacrificial layers are provided. That is, three sacrificial layers 31a, 31b, 31c are provided between the substrate 30 and the pellicle membrane 19.

As with the previous embodiment, a planar substrate 30 is provided, which may be referred to simply as a substrate 30. The substrate 30 may be, for example, a silicon wafer. The substrate 30 has a shape such as a square, a circle or a rectangle, for example. The shape of the substrate 30 is not particularly limited, but is most likely circular as this is the most commonly available shape. The size of the substrate 30 is not particularly limited.

A first sacrificial layer 31a is provided, for example by depositing it on the substrate 30. The first sacrificial layer 31a preferably substantially surrounds the substrate 30, but in some embodiments it may only partially surround the substrate 30. The first sacrificial layer 31a comprises an oxide, for example silicon oxide or a thermal oxide.

A second sacrificial layer 31b is then provided, for example by depositing it on the first sacrificial layer 31a. The second sacrificial layer 31b preferably substantially surrounds the first sacrificial layer 31a, but in some embodiments it may only partially surround the first sacrificial layer 31a. The second sacrificial layer 31b comprises a type of silicon, for example polysilicon or doped silicon, preferably in-situ doped polysilicon (ISDP). Advantageously, a second sacrificial layer 31b comprising ISDP can be formed with relatively low roughness and few protrusions.

Adjacent sacrificial layers (e.g. the first and second sacrificial layers 31a, 31b) formed from different materials (in this instance an oxide and silicon) will etch at different rates for a given etching operation. That is, for a specific etching operation, the first sacrificial layer 31a may etch quickly whereas the second sacrificial layer 31b may etch comparatively slowly or not at all. In this way, adjacent sacrificial layers formed from different materials can advantageously cause one layer to form an etch stop for a given etching operation.

A third sacrificial layer 31c is provided, for example by depositing it on the second sacrificial layer 31b. The third sacrificial layer 31c preferably substantially surrounds the second sacrificial layer 31b, but in some embodiments it may only partially surround the second sacrificial layer 31b. The third sacrificial layer 31c comprises a thin layer of an oxide, for example a silicon oxide or thermal oxide. By thin, it is meant that the thickness of the third sacrificial layer 31c is substantially smaller than the thickness of the pellicle membrane 19. The third sacrificial layer 31c may be known as a thin oxide layer 31c. Thin layers of oxide are easily grown with a well-known layer thickness as is known in the art. As such, a thin oxide layer 31c may be formed with low surface roughness. Hence this provides a smooth surface upon which to deposit the pellicle membrane 19.

The substrate 30 and the first, second and third sacrificial layers 31a, 31b, 31c may be referred to at this stage as a stack.

Prior to depositing the pellicle membrane, the sacrificial layers 31a, 31b, 31c are patterned in order to define an area which will subsequently become the border, thereby defining the shape of the ultimate pellicle assembly. That is, a face of the stack is patterned in order to define the shape of the ultimate pellicle assembly. This face may be referred to as the 'back' of the stack, defined as the opposite face to that which will receive the pellicle membrane 19. This process may be known as a patterning process. This patterning process may be performed using any suitable resist and etch process. During this process, the substrate may be handled by equipment, for example it may be clamped in place and/or inverted. Such handling may risk damaging or contaminating one or more surfaces of the substrate or associated sacrificial layers. By performing this patterning process prior to depositing the pellicle membrane 19, the risk of damage to the pellicle membrane 19 may be reduced. A particular pattern is depicted in FIG. 4, but it should be understood that any alternative pattern may be produced depending on the desired final shape of the pellicle assembly.

Following the patterning process, a pellicle membrane 19 is provided on a face of the third sacrificial layer 31c. The pellicle membrane 19 may comprise one or more pellicle layers. The pellicle membrane 19 shown in FIG. 4 comprises a single pellicle layer. The pellicle layer comprises doped metal silicide, some of the benefits of which are discussed above. The pellicle layer in this embodiment, or in other embodiments, may alternatively comprise metal silicide.

One or more capping layers may be provided with the pellicle layer. These capping layers may be provided as an etch stop for future etching processes. Alternatively or in addition, these capping layers may be provided so as to control the amount of stress on the pellicle layer or pellicle membrane. The capping layer may for example comprise an oxide. The capping layer may beneficially be deposited with a stress comparable to the stress of the third sacrificial layer 31c. The capping layer may beneficially be configured so as to have a similar etch time to the third sacrificial layer 31c.

After deposition of the pellicle membrane 19, further portions of the substrate 30, first sacrificial layer 31a, second sacrificial layer 31b and third sacrificial layer 31c may be selectively back-etched to remove a portion of the substrate 30 (and portions of the sacrificial layers 31a, 31b, 31c) and leave only an outer perimeter to form the frame 17 to support the pellicle membrane 19. The frame 17 therefore comprises a portion of the substrate 30, a portion of the first sacrificial layer 31a, a portion of the second sacrificial layer 31b and a portion of the third sacrificial layer 31c. It can be said that the frame 17 comprises an ordered stack of portions of the substrate 30, first sacrificial layer 31a, second sacrificial layer 31b and third sacrificial layer 31c, before coming into abutment with the pellicle membrane 19. In an example given some of the materials discussed above with reference to this embodiment, the frame 17 may comprise an ordered stack of silicon, an oxide, ISDP, and a thin oxide, before coming into abutment with a doped metal silicide pellicle membrane. Alternatively, the frame 17 may comprise an ordered stack of silicon, an oxide, silicon, and a thin oxide, before coming into abutment with a doped metal silicide pellicle membrane. It should be understood that, depending on the number of sacrificial layers and the composition thereof, the frame 30 may comprise a corresponding ordered stack of layers.

The choice of composition of sacrificial layers may additionally aid in reducing the processing time of a pellicle assembly. For example, some processes constitute 'bottlenecks' in the manufacturing process, e.g. the formation of silicon nitride or ISDP. Beneficially these materials may be omitted from some embodiments of the invention, thereby reducing the processing time.

Figure 5:
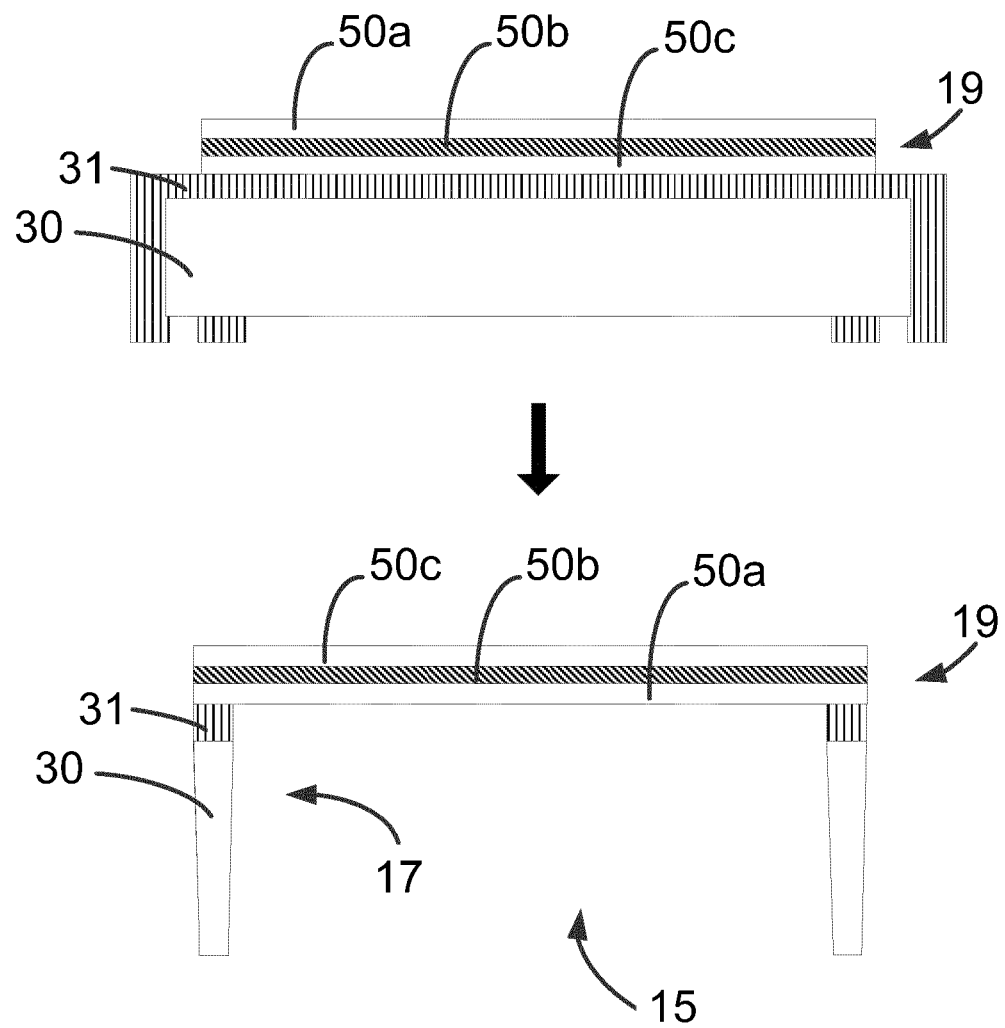
FIG. 5 illustrates stages of manufacture of a pellicle membrane and pellicle assembly according to another embodiment of the present invention.

In the above examples, a process is described for the formation of a pellicle membrane comprising a single doped metal silicide pellicle layer. The pellicle membrane may however comprise multiple pellicle layers. FIG. 5 illustrates an example embodiment of such a pellicle membrane, schematically illustrating stages of manufacture of a pellicle assembly 15 with a pellicle membrane 19 comprising 3 pellicle layers 50a, 50b, 50c.

As with the previous embodiments, a planar substrate 30 is provided, which may be referred to simply as a substrate 30. The substrate 30 may be, for example, a silicon wafer. The substrate 30 has a shape such as a square, a circle or a rectangle, for example. The shape of the substrate 30 is not particularly limited, but is most likely circular as this is the most commonly available shape. The size of the substrate 30 is not particularly limited.

A first sacrificial layer 31 is provided, for example by depositing it on the substrate 30. The substrate 30 and first sacrificial layer 31 may be referred to as a stack. The first sacrificial layer 31 preferably substantially surrounds the substrate 30, but in some embodiments it may only partially surround the substrate 30. The first sacrificial layer 31 may comprise an oxide, for example, silicon oxide or a thermal oxide. The first sacrificial layer 31 beneficially provides a substantially flat surface in preparation for receiving a pellicle layer. While not depicted, additional sacrificial layers may also be provided prior to depositing the pellicle layer. Similarly to the embodiment shown in FIG. 4, the sacrificial layer 31 is patterned prior to deposition of a pellicle layer. This patterning process is performed in order to define an area which will subsequently become the border, thereby defining the shape of the ultimate pellicle assembly. It should be noted however that, while beneficial for reducing damage to the pellicle layer, this patterning process prior to deposition of the pellicle layer is not a requirement.

A first pellicle layer 50a is provided on the first sacrificial layer 31. The first pellicle layer 50a comprises a metal silicide. A second pellicle layer 50b is provided on the first pellicle layer 50a. The second pellicle layer 50b comprises doped metal silicide. A third pellicle layer 50c is provided on the second pellicle layer. The third pellicle layer 50c comprises a metal silicide, for example the same metal silicide that comprises the first pellicle layer 50a. The first, second and third pellicle layers 50a, 50b, 50c form the pellicle membrane 19. It should be understood that a different number of pellicle layers may be deposited in a similar way to form a multi-layer pellicle membrane, for example 2 pellicle layers or 5 pellicle layers.

After deposition of the first, second and third pellicle layers 50a, 50b, 50c, the substrate 30 and first sacrificial layer 31 may be selectively back-etched to remove a portion of the substrate and sacrificial layer and leave only an outer perimeter to form the frame to support the pellicle membrane 19. The frame 17 therefore comprises a portion of the substrate 30 and a portion of the first sacrificial layer 31, wherein the first sacrificial layer 31 is disposed between the substrate 30 and the pellicle membrane 19.

Although the above processes describe the manufacture of a pellicle assembly 15, it should be understood that they also describe the manufacture of a pellicle membrane 19 deposited on a stack (e.g. on a substrate 30 with one or more sacrificial layers). It may be beneficial in some cases to manufacture only the pellicle membrane on the stack, without defining the border, for example if these etch steps are to be performed at a later date or at a different location.

In pellicle manufacture, the final etch stages, for example etching away material to leave only an outer perimeter supporting the pellicle membrane, can be critical with respect the quality of the resulting pellicle membrane. This etch step is commonly performed using a wet etch, for example using a common etchant such as buffered oxide etch (BOE), tetramethylammonium hydroxide (TMAH) or hydrofluoric acid (HF).

The above processes describe the provision of one or more sacrificial layers below the pellicle membrane 19 (i.e. between the pellicle membrane 19 and the substrate 30). However, it may be beneficial to provide sacrificial layers above the pellicle membrane 19 (i.e. to the face of the pellicle membrane 19 distal to the substrate 30), for example to protect the top surface of the pellicle membrane 19 during additional processing steps.

It may be beneficial to provide sacrificial layers both above and below the pellicle membrane. By providing a sacrificial layer both above and below the pellicle membrane, and by matching the thicknesses of the sacrificial layer above and the sacrificial layer below the pellicle membrane, over-etching can be mitigated. For example, with a matched thickness between sacrificial layers above and below the pellicle membrane, the sacrificial layer above will etch at the same speed as the sacrificial layer below. This is in contrast to unmatched layers, which will etch at different speeds, and therefore one layer may either under-etch or overetch.

It should be understood that 'above' and 'below' are relative terms, used with respect the Figures in their presented orientation. These terms should not be construed as limiting, as the pellicle assembly and precursor stages may be orientated in any way.

Figure 6:
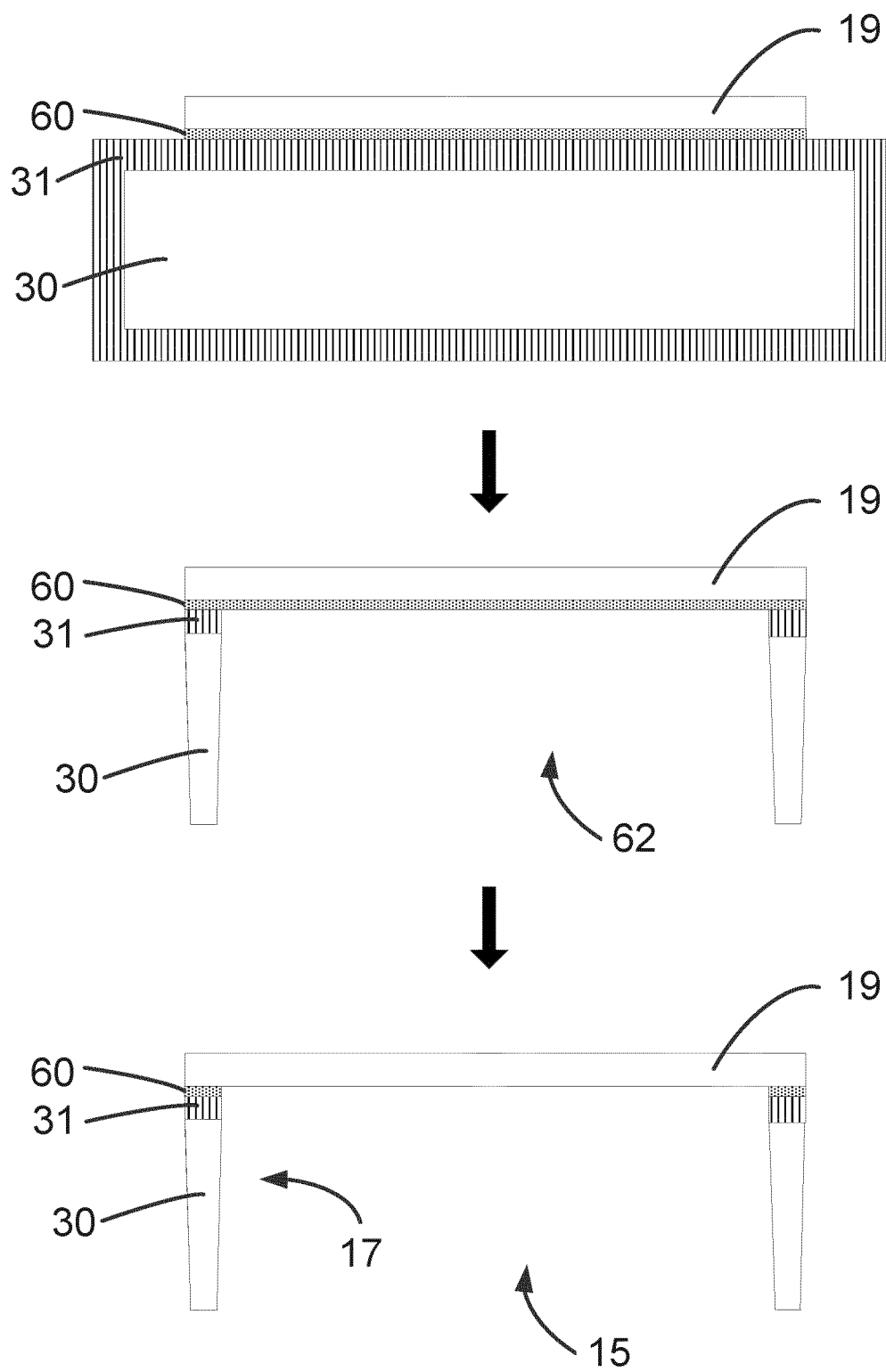
FIG. 6 illustrates stages of manufacture of a pellicle membrane and pellicle assembly according to another embodiment of the present invention.

FIG. 6 schematically illustrates stages of manufacture of a pellicle assembly 15 according to an embodiment of the invention. The pellicle assembly (and precursor stages) are illustrated in cross-section.

A planar substrate 30 is provided, which may be referred to simply as a substrate 30. The substrate 30 may be, for example, a silicon wafer. The substrate 30 has a shape such as a square, a circle or a rectangle, for example. The shape of the substrate 30 is not particularly limited, but is most likely circular as this is the most commonly available shape. The size of the substrate 30 is not particularly limited.

A first sacrificial layer 31 is provided, for example by depositing it on the substrate 30. The substrate 30 and first sacrificial layer 31 may be referred to as a stack. The first sacrificial layer 31 preferably substantially surrounds the substrate 30, but in some embodiments it may only partially surround the substrate 30. The first sacrificial layer 31 may comprise an oxide, for example, silicon oxide or a thermal oxide.

A second sacrificial layer 60 is provided adjacent the first sacrificial layer 31. This forms an updated stack, the stack comprising a planar substrate 30, the first sacrificial layer 31 and the second sacrificial layer 60. In this embodiment, the second sacrificial layer 60 comprises amorphous carbon. As such an amorphous carbon layer 60 may be provided before providing the pellicle membrane 19, although it will be appreciated that the layers could be provided in a different sequence.

A pellicle membrane 19 is provided on a face of the amorphous carbon layer 60. The pellicle membrane 19 may comprise one or more pellicle layers. The pellicle membrane 19 shown in FIG. 6 comprises a single pellicle layer which forms the pellicle membrane 19.

After deposition of the pellicle membrane 19, the substrate 30 and first sacrificial layer 31 be selectively back-etched to remove a central portion of the substrate and sacrificial layer and leave only an outer perimeter to form a frame to support the pellicle membrane 19 and amorphous carbon layer 60. This frame supporting the pellicle membrane 19 and amorphous carbon layer 60 may be known as a pre-assembly 62.

Finally, a portion of the amorphous carbon layer 60 can be removed to leave only an outer perimeter to form a frame 17 to support the pellicle membrane 19, thereby forming a pellicle assembly 15. The frame 17 therefore comprises a portion of the substrate 30, a portion of the first sacrificial layer 31, and a portion of the amorphous carbon layer 60, wherein the amorphous carbon layer 60 is disposed between the first sacrificial layer 31 and the pellicle membrane 19. A number of processes can be used to remove the amorphous carbon layer 60, for example plasma treatment using e.g. free radicals such as hydrogen radicals. Indeed any suitable method may be used to remove the amorphous carbon and the invention is not particularly limited by the particular method used.

Amorphous carbon is highly etch resistant to a number of common etchants, for example, but not limited to, buffered oxide etch (BOE), tetramethylammonium hydroxide (TMAH) and hydrofluoric acid (HF). Amorphous carbon can be removed from the pre-assembly 62, for example using plasma treatment, without damaging the pellicle membrane 19. Plasma treatment is a fast process compared to etching, so the use of an amorphous carbon layer followed by its subsequent removal using plasma treatment beneficially represents a time saving in the pellicle manufacturing process.

The provision of an amorphous carbon layer 60 significantly reduces the chance of overetching, thereby reducing the risk of damage to the pellicle membrane 19 in an etching step. For example, during the etching step to selectively remove a central portion of the substrate and sacrificial layer, the amorphous carbon layer 60 can reduce or mitigate the chance of an etchant removing any portion of the pellicle membrane (i.e. overetching). This results in an increase in yield in pellicle membrane manufacture as the chance of damage or breakage to the pellicle membrane is reduced or mitigated. Additionally, due to the amorphous carbon layer's resistance to etching, a more aggressive and/or faster etch process may be used to remove adjacent layers without jeopardizing the integrity of the pellicle membrane. Therefore, such an etching process may be performed more quickly than without an amorphous carbon layer, beneficially representing a time saving in the pellicle manufacturing process.

The use of an amorphous carbon layer also provides greater flexibility in choosing other sacrificial layers, for example characteristics of sacrificial layers such as the composition and/or thickness. The flexibility in sacrificial layer choice is provided due to the etch stop capabilities of amorphous carbon; thereby reducing the technical and design constraints on other sacrificial layers that were previously required to reduce over-etching.

The use on an amorphous layer also provides greater flexibility in choosing pellicle layer materials due to its high etch resistance. The use of an etch stop layer such as an amorphous carbon layer is particularly beneficial when used in combination with a metal silicide or doped metal silicide pellicle layer. Metal silicides and doped metal silicides are particularly sensitive to over-etching, so it beneficial to reduce the chance of over-etching for example by using an amorphous carbon layer. Additionally, an etch stop layer such as an amorphous carbon layer is particularly beneficial when used with other materials that are easily wet etched, for example zirconium.

The amorphous carbon layer 60 may be provided below the pellicle membrane 19 as shown in FIG. 6. An amorphous carbon layer may also be provided above the pellicle membrane which may protect the top layer of the pellicle membrane 19 from overetching, as well as from other potential damage in other processing steps. An amorphous carbon layer may additionally be used at other stages in the pellicle manufacture process to protect and/or reduce over-etching of other surfaces.

Additionally, amorphous carbon provides an efficient diffusion barrier. A diffusion barrier reduces the risk of material diffusion between adjacent layers. For example, when using a first sacrificial layer comprising an oxide, it is possible for oxygen to diffuse into pellicle membrane. Diffusion may increase when the pre-assembly is heated, for example heating during the thermal treatment of oxides or during annealing processes which are common in pellicle manufacture.

It may be beneficial to reduce diffusion into the pellicle layers. For example, it may be beneficial to optimize the EUV transmissivity of a pellicle membrane, whereas diffused materials may reduce the EUV transmissivity. In a specific example, diffusion of oxygen from a sacrificial layer comprising an oxide into a pellicle layer comprising a metal silicide may form a metal oxide, which has a reduced EUV transmissivity compared to the metal silicide with no metal oxide. A diffusion barrier, for example an amorphous carbon layer, between the sacrificial layer and the pellicle layer may hence optimize the EUV transmissivity of the pellicle membrane.

By providing a layer of amorphous carbon between an oxide sacrificial layer and a metal silicide pellicle layer, diffusion of elements between the sacrificial layer and pellicle layer is reduced. An amorphous carbon diffusion barrier layer may reduce diffusion between layers to an effectively negligible level. That is, effectively no diffusion takes place across the diffusion barrier, even during or after heating. Additionally, there is no diffusion of carbon from the amorphous carbon layer into the pellicle membrane.

Additionally, an amorphous carbon layer 60 can be used as a stress-controlling element. By controlling characteristics of the layer(s) adjacent the pellicle membrane 19, the amount of stress in the pellicle membrane 19 during manufacture can be reduced. An amorphous carbon layer can act as a stress-reducing element, reducing the amount of stress on the pellicle membrane 19 during manufacture, or it can apply stress, for example as a pre-stressing element.

The thickness of the amorphous carbon layer can be selected to control the amount of diffusion, as well as to optimize other physical properties of the layer such as stress control. For example, an amorphous carbon layer with a thickness substantially thinner than the pellicle membrane may beneficially provide efficient barrier to diffusion, as well as providing an etch stop layer, as well as beneficially pre-stressing the pellicle layer.

In another embodiment, an amorphous carbon layer is used as a pellicle core layer between two pellicle layers. For example, the pellicle membrane may comprise an ordered set of a metal silicide layer, an amorphous carbon layer, and a second metal silicide layer. Beneficially, the amorphous carbon layer in this embodiment may beneficially tune the amount of tension in the pellicle membrane. Controlling the tension in the pellicle membrane may reduce sagging in the pellicle membrane.

FIGS. 7a to i schematically illustrate stages of manufacture of a pellicle assembly 15 according to an embodiment of the invention. The pellicle assembly (and precursor stages) are illustrated in cross-section. It should be noted that not all intermediate stages are illustrated.

Figure 7A:
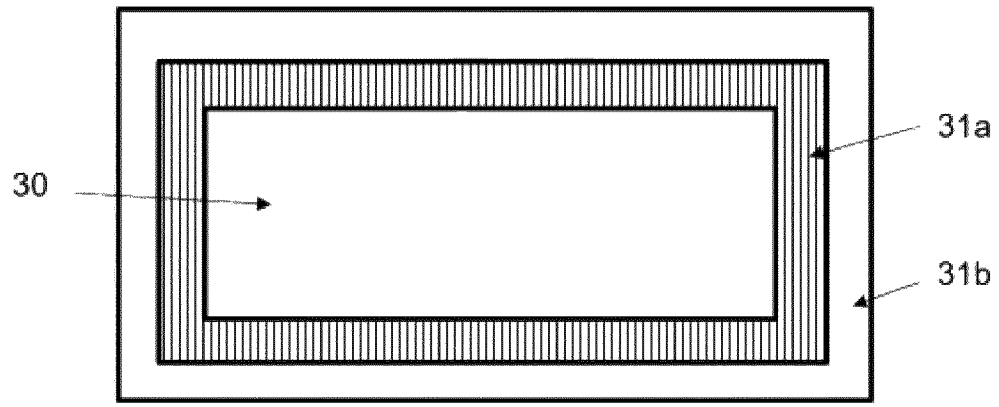
FIG. 7 illustrates stages of manufacture of a pellicle membrane and pellicle assembly according to another embodiment of the present invention.

As with the previous embodiments, as depicted in FIG. 7a, a planar substrate 30 is provided, which may be referred to simply as a substrate 30. The substrate 30 may be, for example, a silicon wafer. The substrate 30 has a shape such as a square, a circle or a rectangle, for example. The shape of the substrate 30 is not particularly limited, but is most likely circular as this is the most commonly available shape. The size of the substrate 30 is not particularly limited.

A first sacrificial layer 31a is provided, for example by depositing it on the substrate 30. The first sacrificial layer 31a preferably substantially surrounds the substrate 30, but in some embodiments it may only partially surround the substrate 30. The first sacrificial layer 31a preferably comprises an oxide, for example silicon oxide or a thermal oxide. The first sacrificial layer 31a may comprise silicon dioxide or may consist essentially of silicon dioxide.

A second sacrificial layer 31b is then provided, for example by depositing it on the first sacrificial layer 31a. The second sacrificial layer 31b preferably substantially surrounds the first sacrificial layer 31a, but in some embodiments it may only partially surround the first sacrificial layer 31a. The second sacrificial layer 31b comprises a type of silicon, for example polysilicon or doped silicon, preferably in-situ doped polysilicon (ISDP). Advantageously, the second sacrificial layer 31b comprising ISDP can be formed with relatively low roughness and few protrusions.

Adjacent sacrificial layers (e.g. the first and second sacrificial layers 31a, 31b) formed from different materials (in this instance an oxide and silicon) will etch at different rates for a given etching operation. That is, for a specific etching operation, the first sacrificial layer 31a may etch quickly whereas the second sacrificial layer 31b may etch comparatively slowly or not at all. In this way, adjacent sacrificial layers formed from different materials can advantageously cause one layer to form an etch stop for a given etching operation.

The first and second sacrificial layers 31a, 31b are patterned in order to define an area which will subsequently become the border, thereby defining the shape of the ultimate pellicle assembly. That is, a face of the stack is patterned in order to define the shape of the ultimate pellicle assembly. This face may be referred to as the 'back' of the stack, defined as the opposite face to that which will receive the pellicle membrane 19. This process may be known as a patterning process. This patterning process may be performed using any suitable resist and etch process. During this process, the substrate may be handled by equipment, for example it may be clamped in place and/or inverted. Such handling may risk damaging or contaminating one or more surfaces of the substrate or associated sacrificial layers. By performing this patterning process prior to depositing the pellicle membrane 19, the risk of damage to the pellicle membrane 19 may be reduced. A particular pattern is depicted in FIG. 7, but it should be understood that any alternative pattern may be produced depending on the desired final shape of the pellicle assembly.

Figure 7B:
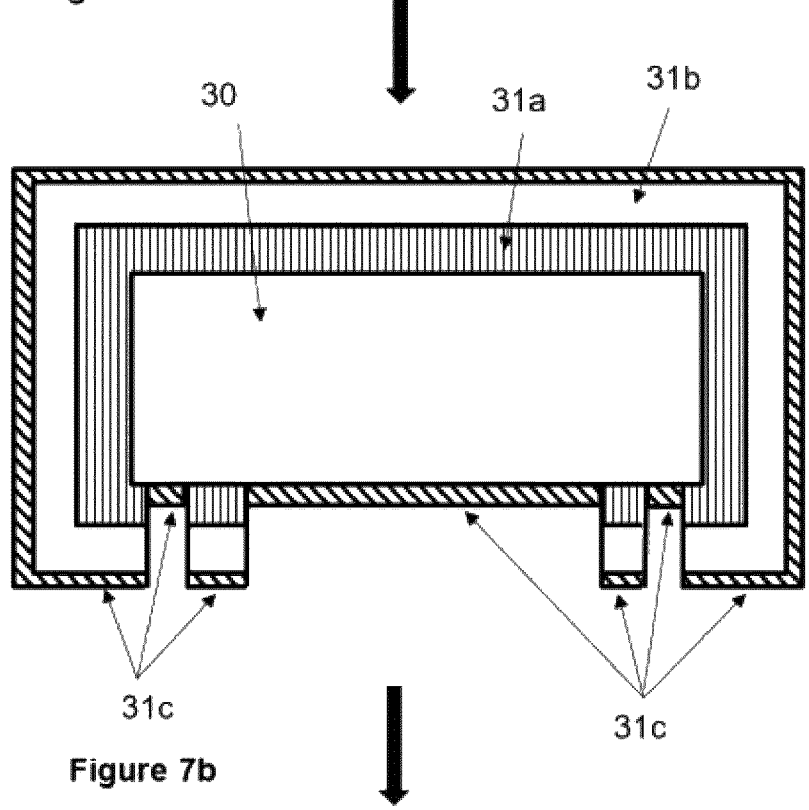

A third sacrificial layer 31c is provided, for example by depositing it on the second sacrificial layer 31b following the patterning process. The third sacrificial layer 31c preferably substantially surrounds the second sacrificial layer 31b, but in some embodiments it may only partially surround the second sacrificial layer 31b. The third sacrificial layer 31c comprises a thin layer of an oxide, for example a silicon oxide or thermal oxide. The oxide layer may be grown by chemical and/or thermal means as is known in the art. By thin, it is meant that the thickness of the third sacrificial layer 31c is substantially smaller than the thickness of the pellicle membrane 19. The third sacrificial layer 31c may be known as a thin oxide layer 31c. Thin layers of oxide are easily grown with a well-known layer thickness as is known in the art. As such, a thin oxide layer 31c may be formed with low surface roughness. Hence this provides a smooth surface upon which to deposit the pellicle membrane 19. FIG. 7b depicts a stack made in accordance with the present invention following the patterning of the back of the stack and subsequent provision of a third sacrificial layer 31c.

The substrate 30 and the first, second and third sacrificial layers 31a, 31b, 31c may be referred to at this stage as a stack.

Figures 7C, 7D:
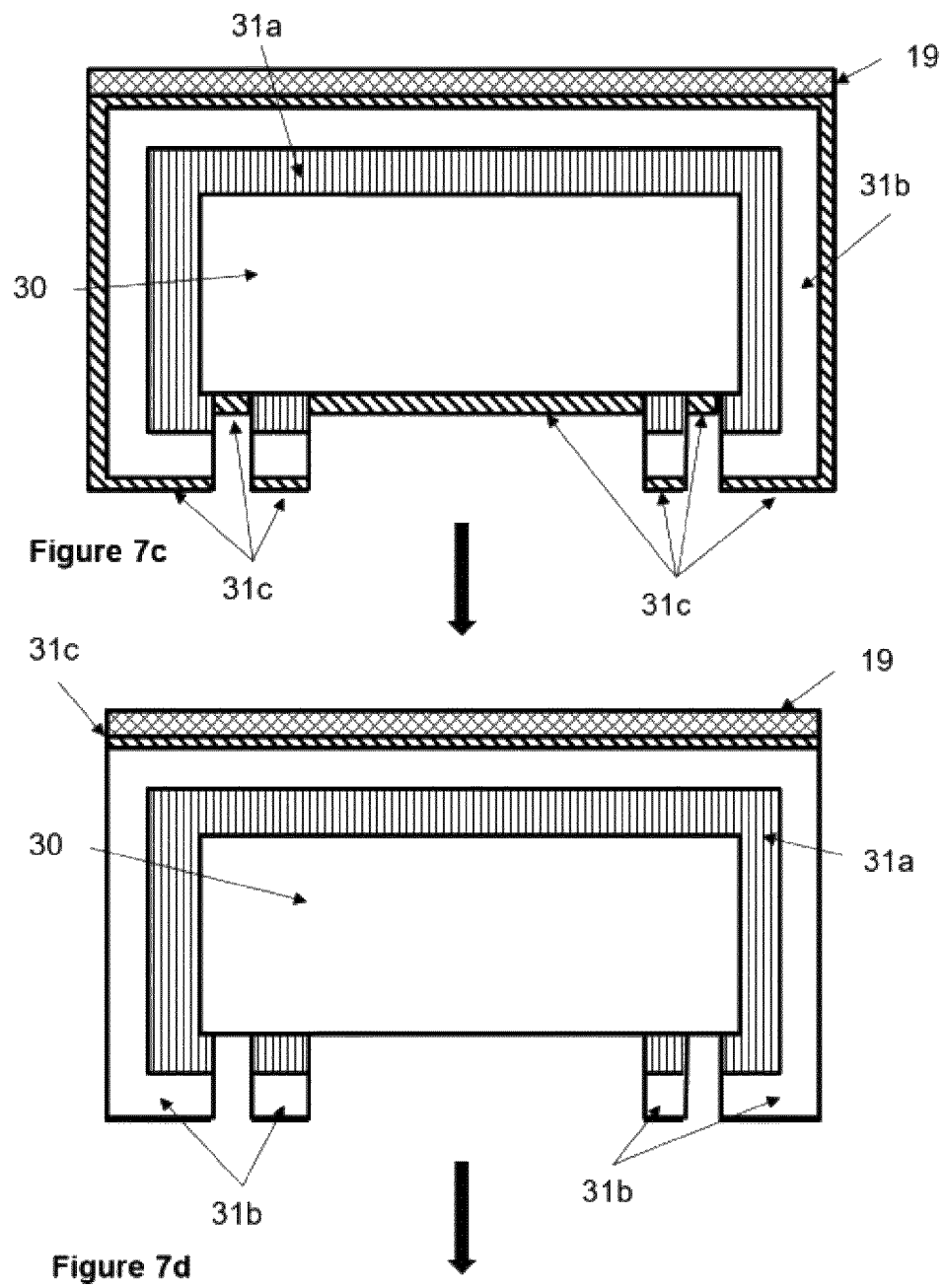

As depicted in FIG. 7c, following the patterning process and subsequent provision of the third sacrificial layer 31c, a pellicle membrane 19 is provided on a face of the third sacrificial layer 31*c*. The pellicle membrane 19 may comprise one or more pellicle layers. The pellicle membrane 19 shown in FIG. 7 comprises a single pellicle layer. The pellicle layer comprises doped metal silicide, some of the benefits of which are discussed above, preferably a MoSiN layer. The pellicle layer in this embodiment, or in other embodiments, may alternatively comprise metal silicide. The pellicle membrane 19 may be provided by any means as known in the art.

One or more capping layers may be provided with the pellicle layer. These capping layers may be provided as an etch stop for future etching processes. Alternatively or in addition, these capping layers may be provided so as to control the amount of stress on the pellicle layer or pellicle membrane. The capping layer may for example comprise an oxide. The capping layer may beneficially be deposited with a stress comparable to the stress of the third sacrificial layer 31*c*. The capping layer may beneficially be configured so as to have a similar etch time to the third sacrificial layer 31*c*.

The one or more capping layers may be provided as an oxide layer, which may derived from TEOS. The provision of the one or more capping layers on top of the pellicle membrane 19 is optional. The stack may be annealed with or without the provision of the one or more capping layers. Annealing of the stack preferably controls the stresses within the stack. The stack may be annealed under conditions as known in the art and the present invention is not particularly limited by the annealing conditions used.

After annealing of the stack, the one or more capping layers as well as the portions of the third sacrificial layer 31*c* may be etched, as depicted in FIG. 7*d*. In cases where one or more capping layers are not provided, it may be a native oxide layer which is etched away. As shown in FIG. 7*d*, this provides a stack with a pellicle membrane 19 provided on top of a third sacrificial layer 31*c*. As such, any sacrificial or capping layer on the surface or top of the pellicle membrane 19 is removed at this stage and the third sacrificial layer 31*c* disposed underneath the pellicle membrane 19 is retained.

The front of the stack may then be patterned to define the dimensions of the ultimate pellicle assembly. The front of the stack may be patterned by any suitable means as is known in the art and the present invention is not particularly limited by the patterning means used.

Figure 7E:
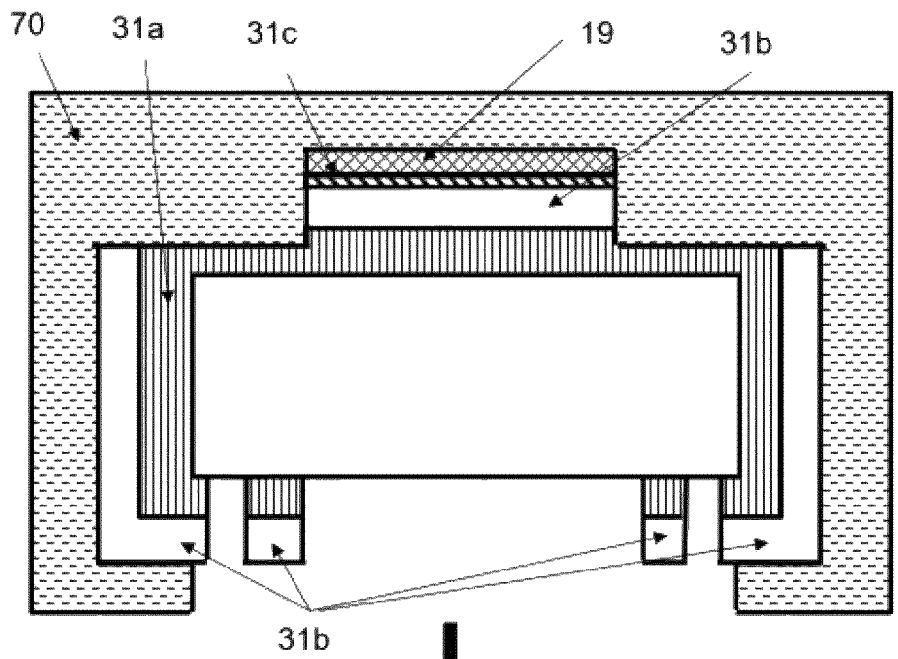

Once the front of the stack has been patterned, a protective layer 70 may be provided. The protective layer may be a polymeric material, such as parylene, as is known in the art. FIG. 7*e* depicts the stack once the front of the stack has been patterned and the protective layer 70 has been provided.

Figure 7F:
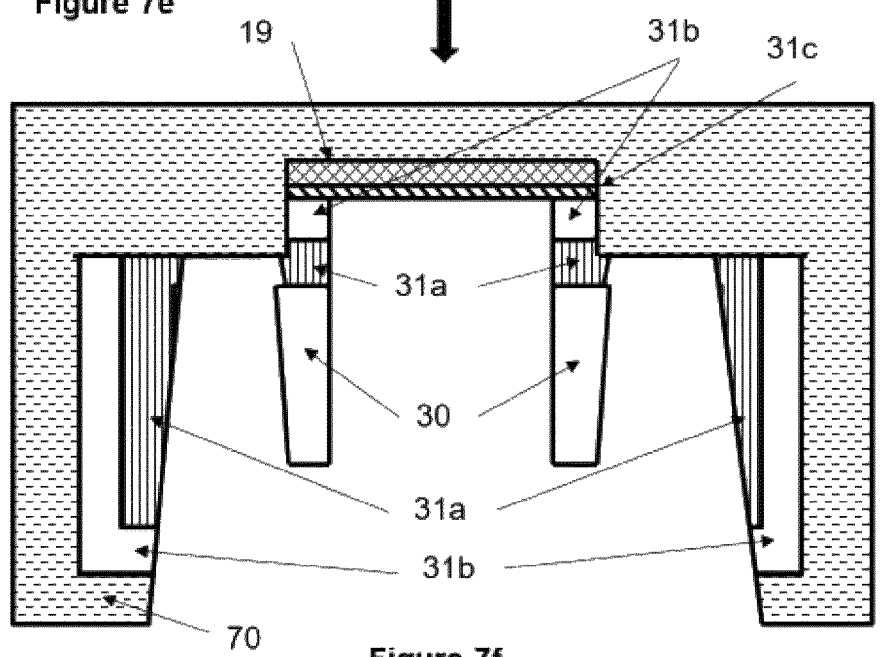
Figure 7G:
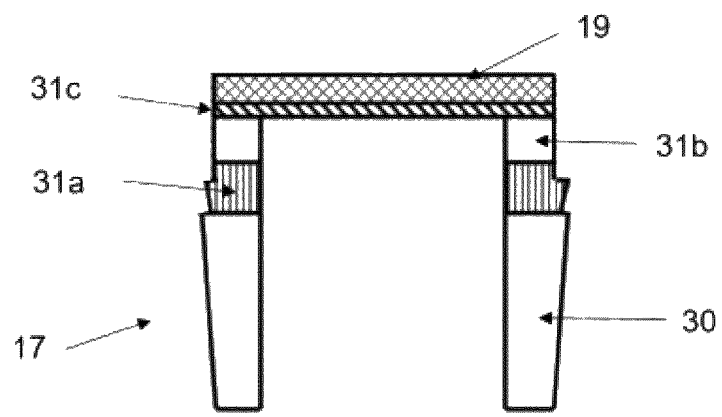
Figure 7H:
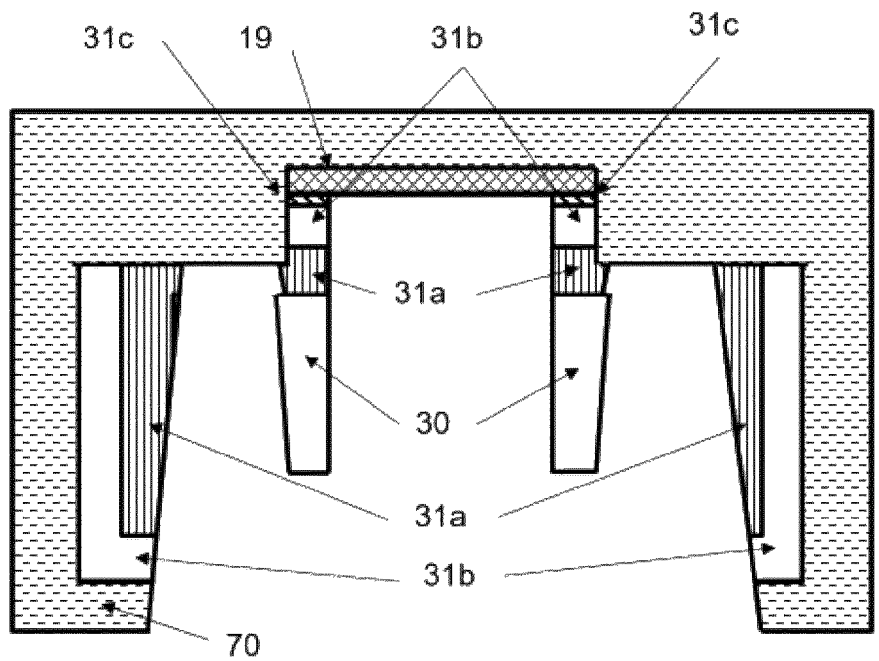

One the protective layer 70 has been provided, a so-called cavity etch process may be conducted. The cavity etch process removes material from the core 30, the first sacrificial layer 31*a*, and the second sacrificial layer 31*b*. FIG. 7*f* shows an embodiment of the invention in which the material of the third sacrificial layer 31*c* lying beneath the pellicle membrane 19 is not removed during the cavity etch process. Alternatively, FIG. 7*h* depicts an embodiment of the invention in which the material of the third sacrificial layer 31*c* lying beneath the pellicle membrane 19 is removed during the cavity etch process.

Figure 7I:
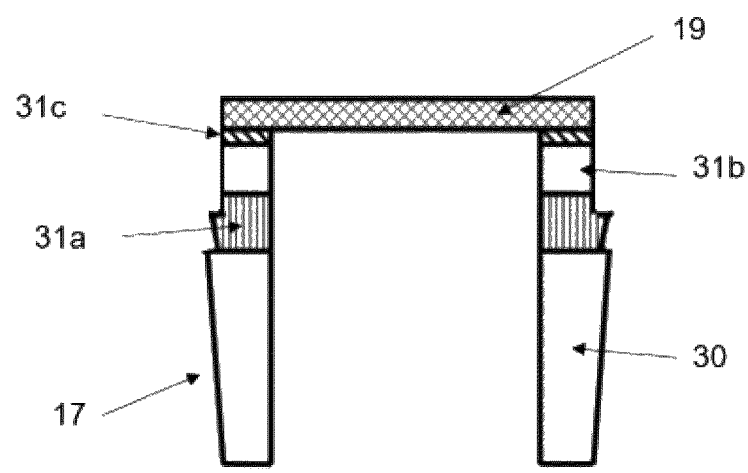

As such, portions of the substrate 30, first sacrificial layer 31*a*, second sacrificial layer 31*b* and optionally a portion of the third sacrificial layer 31*c* are selectively back-etched to remove a portion of the substrate 30 (and portions of the sacrificial layers 31*a*, 31*b*, 31*c* as appropriate) and leave an outer perimeter to form the frame 17 to support the pellicle membrane 19. The frame 17 therefore comprises a portion of the substrate 30, a portion of the first sacrificial layer 31*a*, a portion of the second sacrificial layer 31*b* and a portion of the third sacrificial layer 31*c*. The third sacrificial layer may span the pellicle membrane or not depending on whether it is chosen to etch the third sacrificial layer 31*c* during the cavity etch step or not. It can be said that the frame 17 comprises an ordered stack of portions of the substrate 30, first sacrificial layer 31*a*, second sacrificial layer 31*b* and third sacrificial layer 31*c*, before coming into abutment with the pellicle membrane 19. In an example given some of the materials discussed above with reference to this embodiment, the frame 17 may comprise an ordered stack of silicon, an oxide, ISDP, and a thin oxide, before coming into abutment with a doped metal silicide pellicle membrane, preferably MoSiN. Alternatively, the frame 17 may comprise an ordered stack of silicon, an oxide, silicon, and a thin oxide, before coming into abutment with a doped metal silicide pellicle membrane. It should be understood that, depending on the number of sacrificial layers and the composition thereof, the frame 30 may comprise a corresponding ordered stack of layers. FIG. 7*g* depicts an embodiment of a pellicle assembly in which the third sacrificial layer 31*c* spans the pellicle membrane 19, whereas FIG. 7*i* depicts an embodiment in which the third sacrificial layer 31*c* does not span the pellicle membrane 19.

The choice of composition of sacrificial layers may additionally aid in reducing the processing time of a pellicle assembly. For example, some processes constitute 'bottlenecks' in the manufacturing process, e.g. the formation of silicon nitride or ISDP. Beneficially these materials may be omitted from some embodiments of the invention, thereby reducing the processing time.

Figure 8:
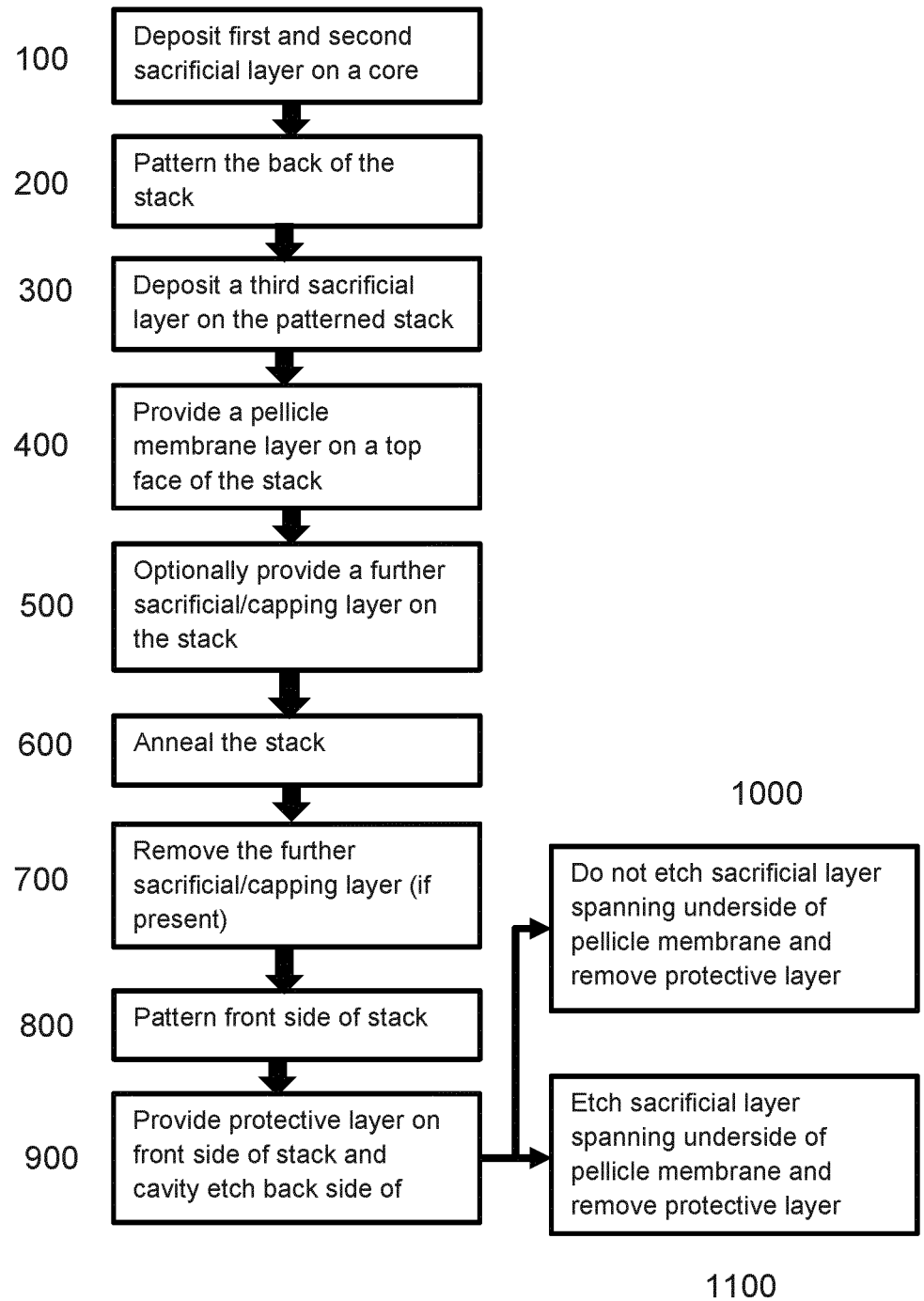
FIG. 8 illustrates a flowsheet of the manufacture of a pellicle assembly.

FIG. 8 is an exemplary flow chart of the method depicted in FIG. 7. In the first stage 100, first and second sacrificial layers are provided in a core. The core is preferably c-Si, although other allotropes of silicon and other materials may also be used. The first sacrificial layer is preferably silicon oxide, preferably silicon dioxide. The second sacrificial layer is preferably silicon based, and may be ISDP. The core, first sacrificial layer, and second sacrificial layer may be referred to as a stack. In stage 200, the back of the stack may be patterned. This may be done by any suitable means and serves to define the shape of the ultimate pellicle assembly by defining the dimensions of the frame which supports the pellicle membrane in the final assembly. In stage 300, a further oxide layer, known as the third sacrificial layer, is provided on the patterned stack. The oxide layer may be formed by any knowns means, such as chemical or thermal oxidation. In stage 400, the material forming the pellicle membrane is deposited or otherwise provided on a surface of the patterned stack. Stage 500 is optional and comprises providing a further sacrificial layer/capping layer on the patterned stack. This may be referred to as a top oxide. In stage 600, the stack is annealed. It has been found that it is possible to perform the annealing step without the need for the extra protection provided by stage 500. In stage 700, the top oxide (if present) and/or any native oxide layer may be removed. Following the removal of the top oxide or native oxide layer (where present), in stage 800, the front side of the stack is patterned to define the shape and dimension of the pellicle membrane. Following the patterning in stage 800, a protective layer, preferably a polymeric protective material such as parylene, is provided to protect the pellicle membrane layer. A cavity etch step is then conducted in stage 900 which etches away the core from the back side and forms the frame of the pellicle assembly. Optionally the sacrificial layer underlying the pellicle membrane is either removed or retained in place in stage 1000 or 1100 as appropriate. The final pellicle assembly may then be released from the protective layer. Since the sacrificial layers which respectively directly overlie and directly underlie the pellicle membrane are removed in different stages, it is possible to avoid the need for a wet-HF etching step to remove such oxide layers. The process as described in FIGS. 7 and 8 thereby avoids the wet HF etching step which can result in damage to the pellicle membrane and possible mechanical loss or failure during manufacture, as well as reduces non-uniformity caused by over-etching of portions of the pellicle membrane.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims and clauses set out below.

1. A method of manufacturing a pellicle membrane, the method comprising:
   providing a first sacrificial layer on a planar substrate to form a stack; and
   providing, to at least a portion of the stack, at least one metal silicide or doped metal silicide pellicle core layer which forms at least part of the pellicle membrane.

2. The method of clause 1, wherein the pellicle core layer is deposited using physical vapor deposition.

3. The method of clause 1 or clause 2, wherein the metal comprises molybdenum.

4. The method of any preceding clause, wherein the dopant comprises nitrogen, boron, and/or carbon.

5. The method of any preceding clause, wherein the first sacrificial layer comprises an oxide.

6. The method of any preceding clause, further comprising providing at least one additional sacrificial layer on the first sacrificial layer prior to providing the at least one pellicle core layer.

7. The method of clause 6, wherein the at least one additional sacrificial layer comprises an oxide or silicon, and preferably wherein the composition of adjacent sacrificial layers alternates between an oxide and silicon.

8. The method of any of clauses 1 to 4, wherein the first sacrificial layer comprises amorphous carbon.

9. The method of clause 6, wherein the at least one additional sacrificial layer comprises amorphous carbon.

10. The method of any preceding clause, wherein three pellicle core layers are provided on the stack, preferably deposited in the following order: a first metal silicide layer, a doped metal silicide layer, and a second metal silicide layer.

11. The method of any preceding clause, further comprising one or more etching steps to remove at least a portion of the substrate and one or more sacrificial layers.

12. The method of clause 11, wherein at least one etching step is performed after depositing one or more sacrificial layers and before depositing the pellicle core layer.

13. The method of any preceding clause, wherein one or more etching steps define a border holding the pellicle membrane.

14. The method of any preceding clause, wherein the planar substrate is an SOI (silicon on insulator) wafer.

15. The method of any preceding clause, wherein the planar substrate is annealed to provide a thermal oxide layer prior to the provision of a tetraethyl orthosilicate layer.

16. The method of any preceding clause, wherein the final etch step is a wet etch, preferably a HF wet etch which etches a tetraethyl orthosilicate layer.

17. The method of clause 16 when dependent on clause 8 or clause 9, further comprising a plasma treatment step following the final etch step, the plasma treatment step removing at least a portion of the amorphous carbon first sacrificial layer or additional sacrificial layer.

18. The method of any preceding clause, wherein the method comprises patterning a back side of the stack following provision of the first and second sacrificial layers on the planar substrate.

19. The method of clause 18, further comprising the ordered steps of:
   i) providing a third sacrificial layer in the form of an oxide to form a bottom oxide;
   ii) depositing the pellicle core layer on a face of the stack;
   iii) optionally depositing a capping layer in the form of a further oxide layer on a top surface of the pellicle core layer to form a top oxide layer;
   iv) annealing the stack;
   v) optionally removing the top oxide layer (where present) and/or any native oxide layer;
   vi) patterning a front side of the stack;
   vii) providing a protective layer to protect the front side of the stack; and
   viii) conducting a cavity etch from the back side of the stack to remove a portion of the planar substrate, first sacrificial layer, second sacrificial layer, and optionally a portion of the third sacrificial layer to define a pellicle assembly.

20. The method of clause 19, wherein the capping layer of step iii) is formed from TEOS.

21. The method of clause 19 or clause 20, wherein the protective layer is formed of a polymeric material, preferably perylene.

22. The method of any of clauses 19 to 21 further comprising removing the protective layer to release a pellicle membrane assembly.

23. The method of any of clauses 19 to 22, wherein the third sacrificial layer is a chemical oxide or a thermal oxide.

24. The method of any of clauses 19 to 23, wherein said method does not include a wet HF etching step.

25. A pellicle membrane assembly comprising a substrate, a first sacrificial layer, and at least one metal silicide or doped metal silicide pellicle layer which forms at least part of a pellicle core.

26. The assembly of clause 25, further comprising at least one additional sacrificial layer disposed between the first sacrificial layer and the at least one pellicle core.

27. The assembly of clause 26, wherein the assembly comprises at least three sacrificial layers, wherein the first and third sacrificial layers comprise the same material, preferably a thermal oxide.

28. The assembly of any of clauses 25 to 27, wherein the at least one pellicle core layer comprises a first pellicle layer, a second pellicle layer, and a third pellicle layer.

29. The assembly of clause 28, wherein the first and third pellicle layers comprise metal silicide and the second pellicle core layer comprises doped metal silicide, preferably wherein the metal comprises molybdenum.

30. The assembly of any of clauses 25 to 29, wherein the substrate forms at least part of a border holding the pellicle membrane.

31. The assembly of clause 30, wherein the border comprises an ordered stack of: a portion of a planar substrate, and at least one sacrificial layer, wherein the at least one sacrificial layer is adjacent the pellicle membrane.

32. The assembly of clause 31, wherein the at least one sacrificial layer comprises an oxide or silicon, and preferably wherein the composition of adjacent sacrificial layers alternates between an oxide and silicon.

33. The assembly of any of clauses 25 to 32, wherein the sacrificial layer adjacent the pellicle membrane comprises an oxide and is substantially thinner than the pellicle membrane.

34. The assembly of clause 25 or clause 26, wherein the first sacrificial layer or at least one at least on additional sacrificial layer comprises amorphous carbon.

35. The assembly of clause 34, wherein the sacrificial layer adjacent the pellicle membrane comprises amorphous carbon and is preferably substantially thinner than the pellicle membrane.

36. The assembly of clause 28, wherein the first and third pellicle layers comprise metal silicide and the second pellicle core layer comprises amorphous carbon.

37. A method of manufacturing a pellicle membrane, the method comprising: providing at least one amorphous carbon layer adjacent to a pellicle layer which forms at least a part of the pellicle membrane.

38. The method of clause 31, wherein the pellicle core layer comprises metal silicide or doped metal silicide.

39. A pellicle membrane assembly comprising a substrate, at least one amorphous carbon layer, and a pellicle membrane.

40. The assembly of clause 39, wherein the pellicle membrane comprises metal silicide, doped metal silicide or zirconium.

41. The assembly of clause 39 or clause 40, wherein the thickness of the amorphous carbon layer is substantially thinner than the pellicle membrane.

42. The assembly of any of clauses 39 to 41, wherein the substrate forms at least part of a border holding the pellicle membrane.

43. The assembly of clause 42, wherein the border comprises an ordered stack of: a portion of a planar substrate, and a portion of an amorphous carbon layer, wherein the at least one amorphous carbon layer is adjacent the pellicle membrane.

44. A lithographic apparatus comprising the pellicle assembly of any of clauses 25 to 36 or 39 to 43 or manufactured according to any of clauses 1 to 24, 37 or 38.

It should be understood that the features of the above embodiments may be combined. For example, while described in different embodiments, the use of an amorphous carbon layer is applicable for use with a with a pellicle membrane comprising 3 pellicle layers, a pellicle assembly comprising 3 sacrificial layers, or any other feature discussed above. The pellicle membrane may comprise one or more metal silicide layers and/or one or more doped metal silicide layers and/or one or more amorphous carbon layers.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of manufacturing a pellicle membrane, the method comprising:
   providing a first sacrificial layer onto a planar substrate to form a stack;
   providing, onto at least a portion of the stack, at least one metal silicide or doped metal silicide pellicle core layer which forms at least part of the pellicle membrane; and
   providing at least one additional sacrificial layer on the first sacrificial layer prior to providing the at least one pellicle core layer, wherein the at least one additional sacrificial layer is arranged to have controlled stress in the at least one additional sacrificial layer.

2. The method of claim 1, wherein the metal comprises molybdenum.

3. The method of claim 1, wherein the providing the at least one metal silicide or doped metal silicide pellicle core layer comprises providing at least one doped metal silicide pellicle core layer and a dopant of the doped metal silicide comprises nitrogen, boron, and/or carbon.

4. The method of claim 1, wherein the first sacrificial layer comprises an oxide.

5. The method of claim 1, wherein the at least one additional sacrificial layer comprises an oxide or silicon.

6. The method of claim 1, wherein three pellicle core layers are provided on the stack.

7. The method of claim 1, wherein the planar substrate is annealed to provide a thermal oxide layer prior to the provision of a tetraethyl orthosilicate layer.

8. A pellicle arrangement, comprising:
   the pellicle membrane assembly according to claim 1; and a pellicle frame to support the pellicle membrane assembly on a mask.

9. A pellicle membrane assembly comprising:
a substrate,
a first sacrificial layer,
at least one metal silicide or doped metal silicide pellicle layer which forms at least part of a pellicle core, and
at least one additional sacrificial layer disposed between the first sacrificial layer and the at least one pellicle core layer, wherein the at least one additional sacrificial layer is arranged to have controlled stress in the at least one additional sacrificial layer.

10. The assembly of claim 9, comprising at least three sacrificial layers, wherein the first and third sacrificial layers comprise the same material.

11. The assembly of claim 9, wherein the at least one pellicle core layer comprises a first pellicle layer, a second pellicle layer, and a third pellicle layer.

12. The assembly of claim 11, wherein the first and third pellicle layers comprise metal silicide and the second pellicle layer comprises doped metal silicide.

13. The assembly of claim 11, wherein the first and third pellicle layers comprise metal silicide and the second pellicle core layer comprises amorphous carbon.

14. The assembly of claim 9, wherein the sacrificial layer adjacent the pellicle membrane comprises an oxide and is substantially thinner than the pellicle membrane.

15. The assembly of claim 9, wherein the first sacrificial layer or at least one sacrificial layer of the at least one additional sacrificial layer comprises amorphous carbon.

16. The assembly of claim 15, wherein the sacrificial layer adjacent the pellicle membrane comprises amorphous carbon.

17. A lithographic apparatus comprising the pellicle assembly of claim 9.

18. A pellicle arrangement, comprising:
the pellicle membrane assembly according to claim 9; and
a pellicle frame to support the pellicle membrane assembly on a mask.

19. A pellicle membrane assembly comprising:
a substrate,
at least one amorphous carbon layer,
a pellicle membrane, and
at least one sacrificial layer disposed between the at least one amorphous carbon layer and the pellicle membrane, wherein the at least one sacrificial layer and/or the at least one amorphous carbon layer is arranged to have controlled stress in the respective at least one sacrificial layer and/or at least one amorphous carbon layer.

20. The assembly of claim 19, wherein the pellicle membrane comprises metal silicide, doped metal silicide or zirconium.

* * * * *